(12) United States Patent
Baek et al.

(10) Patent No.: US 9,754,880 B2
(45) Date of Patent: Sep. 5, 2017

(54) SEMICONDUCTOR DEVICES INCLUDING A CONTACT STRUCTURE AND METHODS OF MANUFACTURING THE SAME

(71) Applicants: Jae-Jik Baek, Seongnam-si (KR); Kee-Sang Kwon, Hwaseong-si (KR); Sang-Jine Park, Yongin-si (KR); Bo-Un Yoon, Seoul (KR)

(72) Inventors: Jae-Jik Baek, Seongnam-si (KR); Kee-Sang Kwon, Hwaseong-si (KR); Sang-Jine Park, Yongin-si (KR); Bo-Un Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/016,376

(22) Filed: Feb. 5, 2016

(65) Prior Publication Data

US 2016/0315045 A1 Oct. 27, 2016

(30) Foreign Application Priority Data

Apr. 22, 2015 (KR) .................. 10-2015-0056597

(51) Int. Cl.
*H01L 23/52* (2006.01)
*H01L 23/528* (2006.01)
*H01L 23/522* (2006.01)
*H01L 23/532* (2006.01)
*H01L 27/088* (2006.01)
*H01L 21/8234* (2006.01)

(52) U.S. Cl.
CPC ........ *H01L 23/528* (2013.01); *H01L 23/5226* (2013.01); *H01L 23/5283* (2013.01); *H01L 23/53223* (2013.01); *H01L 23/53238* (2013.01); *H01L 23/53266* (2013.01); *H01L 21/823475* (2013.01); *H01L 27/088* (2013.01); *H01L 27/0886* (2013.01)

(58) Field of Classification Search
CPC ............... H01L 23/5226; H01L 23/528; H01L 23/5283; H01L 23/53223; H01L 23/53266
USPC ............... 257/751, 752, 767, 773, 774, 775
See application file for complete search history.

(56) References Cited

U.S. PATENT DOCUMENTS 5,923,998 A 7/1999 Liu
6,111,319 A 8/2000 Liou et al.
(Continued)

FOREIGN PATENT DOCUMENTS

KR 2004-0005314 A 1/2004
KR 2006-0115496 A 11/2006
KR 2007-0050605 A 5/2007

*Primary Examiner* — Matthew E Warren
(74) *Attorney, Agent, or Firm* — Harness, Dickey & Pierce, P.L.C.

(57) ABSTRACT

The semiconductor device may include an insulating interlayer on the substrate, the substrate including a contact region at an upper portion thereof, a main contact plug penetrating through the insulating interlayer and contacting the contact region, the main contact plug having a pillar shape and including a first barrier pattern and a first metal pattern, and an extension pattern surrounding on an upper sidewall of the main contact plug, the extension pattern including a barrier material. In the semiconductor device, an alignment margin between the contact structure and an upper wiring thereon may increase. Also, a short failure between the contact structure and the gate electrode may be reduced.

19 Claims, 22 Drawing Sheets

(56) References Cited

U.S. PATENT DOCUMENTS

| | | |
|---|---|---|
| 6,329,225 B1 | 12/2001 | Rodder |
| 6,352,899 B1 | 3/2002 | Sakiyama et al. |
| 6,359,301 B1 * | 3/2002 | Kuroda ............ H01L 21/32053 |
| | | 257/306 |
| 6,803,307 B1 | 10/2004 | Chu |
| 7,018,914 B2 | 3/2006 | Cho et al. |
| 7,074,718 B2 | 7/2006 | Kim et al. |
| 7,183,223 B1 | 2/2007 | Tabery et al. |
| 7,297,998 B2 | 11/2007 | Kim et al. |
| 7,511,349 B2 | 3/2009 | Tsai et al. |
| 7,679,133 B2 | 3/2010 | Son et al. |
| 7,709,866 B2 | 5/2010 | Rahhal-Orabi et al. |
| 7,879,736 B2 | 2/2011 | Hwang et al. |
| 7,910,485 B2 | 3/2011 | Yi |
| 8,236,699 B2 | 8/2012 | Jeon et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,716,126 B2 | 5/2014 | Werner et al. |
| 2004/0016946 A1 * | 1/2004 | Oashi ................. H01L 23/5226 |
| | | 257/296 |
| 2004/0121590 A1 | 6/2004 | Moon et al. |
| 2006/0108650 A1 | 5/2006 | Cho et al. |
| 2006/0183286 A1 | 8/2006 | Lee |
| 2007/0281461 A1 | 12/2007 | Jang |
| 2010/0162194 A1 | 6/2010 | Qian |
| 2012/0302102 A1 | 11/2012 | Stoner |
| 2015/0102491 A1 * | 4/2015 | Miyazaki ................ H01L 29/45 |
| | | 257/751 |

* cited by examiner

SEMICONDUCTOR DEVICES INCLUDING A
CONTACT STRUCTURE AND METHODS OF
MANUFACTURING THE SAME

CROSS-REFERENCE TO RELATED APPLICATION

This application claims priority under 35 USC §119 to Korean Patent Application No. 10-2015-0056597, filed on Apr. 22, 2015 in the Korean Intellectual Property Office (KIPO), the contents of which are herein incorporated by reference in their entirety.

TECHNICAL FIELD

Example embodiments relate to a semiconductor device including a contact structure, and/or a method of manufacturing of the same.

BACKGROUND

As semiconductor devices have been highly integrated, it is typically required to form a contact plug having a wide upper surface without forming an electrical short with other conductive structures in the semiconductor device.

SUMMARY

Example embodiments relate to a semiconductor device including a contact plug having good electrical characteristics.

Example embodiments relate to method of manufacturing a semiconductor device including a contact plug having good electrical characteristics.

According to example embodiments, a semiconductor device may include an insulating interlayer on the substrate, the substrate including a contact region at an upper portion thereof, a main contact plug penetrating through the insulating interlayer and contacting the contact region, the main contact plug having a pillar shape and including a first barrier pattern and a first metal pattern, and an extension pattern surrounding on an upper sidewall of the main contact plug, the extension pattern including a barrier material.

In example embodiments, the first metal pattern may have a pillar shape, and the first barrier pattern may cover a sidewall and a bottom of the first metal pattern. A top surface of the first barrier pattern may be lower than a top surface of the first metal pattern.

In example embodiments, a top surface of the main contact plug may be substantially coplanar with a top surface of the extension pattern.

In example embodiments, the extension pattern may directly contact an upper sidewall of the first metal pattern of the main contact plug.

In example embodiments, all or most portions of the extension pattern may include the barrier material.

In example embodiments, the extension pattern may include a second barrier pattern and a second metal pattern.

In example embodiments, the second barrier pattern may contact a top surface of the first barrier pattern, an upper sidewall of the first metal pattern and a portion of the insulating interlayer, and the second metal pattern may be formed on the second barrier pattern.

In example embodiments, the barrier material of the extension pattern may include at least one of titanium (Ti), titanium nitride (TiN), tantalum (Ta), tantalum nitride (TaN), TiAlC, cobalt (Co), ruthenium (Ru), and nickel (Ni).

According to example embodiments, there is provided a semiconductor device. The semiconductor device may include a plurality of conductive structures on a substrate, the substrate including a contact region at an upper portion between the conductive structures, each of the conductive structures including a conductive pattern and a capping pattern, and the capping pattern surrounding a surface of the conductive pattern, an insulating interlayer covering the conductive structures on the substrate, a top surface of the insulating interlayer being higher than top surfaces of the conductive structures, a main contact plug penetrating the insulating interlayer and contacting the contact region, the main contact plug having a pillar shape and including a first barrier pattern and a first metal pattern, and an extension pattern surrounding an upper sidewall of the main contact plug, the extension pattern including a barrier material.

In example embodiments, the main contact plug may have a first width that is substantially the same as or smaller than a second width of the contact region.

In example embodiments, a bottom of the extension pattern may be higher than top surfaces of the conductive structures.

In example embodiments, the extension pattern may be spaced apart from and partially overlap one or more of the conductive structures vertically.

In example embodiments, one or more of the conductive structures may include a structure and a spacer on a sidewall of the structure, the structure may include a gate insulation pattern, a gate electrode and a hard mask sequentially stacked.

In example embodiments, the gate electrode may include a metal, and the gate insulation pattern may cover a sidewall and a bottom of the gate electrode.

In example embodiments, the barrier material of the extension pattern may include at least one of titanium (Ti), titanium nitride (TiN), tantalum (Ta), tantalum nitride (TaN), TiAlC, cobalt (Co), ruthenium (Ru), and nickel (Ni).

According to example embodiments, there is provided a method of manufacturing a semiconductor device. In the method, an insulating interlayer may be formed on a substrate, the substrate may include a contact region at an upper portion thereof. A main contact plug may be formed through the insulating interlayer to contact the contact region, the main contact plug may have a pillar shape and may include a first barrier pattern and a metal pattern. A portion of the insulating interlayer adjacent to a sidewall of the main contact plug may be etched to form a recess exposing an upper sidewall of the main contact plug. An extension pattern including a barrier material may be formed in the recess.

In example embodiments, when the main contact plug is formed, a portion of the insulating interlayer may be etched to form a contact hole exposing the contact region. A preliminary first barrier pattern may be formed on the exposed contact region and a sidewall of the contact hole. A first metal pattern may be formed on the preliminary first barrier pattern to fill the contact hole. An upper portion of the preliminary first barrier pattern may be etched to form a preliminary recess exposing an upper sidewall of the first metal pattern and a first barrier pattern having a top surface that is lower than a top surface the first metal pattern.

In example embodiments, after partially etching the upper portion of the preliminary first barrier pattern, an upper portion of the insulating interlayer that is adjacent to the preliminary recess may be isotropically etched to form the recess.

In example embodiments, when the extension pattern is formed, a second barrier layer may be formed to fill the recess. The second barrier layer may be planarized to expose a top surface of the insulating interlayer.

In example embodiments, when the extension pattern is formed, a second barrier layer may be conformally formed on an inner wall of the recess. A second metal layer may be formed on the second barrier layer to fill a remaining portion of the recess. The second metal layer and second barrier layer may be planarized to expose a top surface of the insulating interlayer.

According to example embodiments, there is provided a method of manufacturing a semiconductor device. In the method, a plurality of conductive structures may be formed on a substrate. The substrate may include a contact region at an upper portion between the conductive structures, and each of the conductive structures may include a conductive pattern and a capping pattern. The capping pattern may surround a surface of the conductive pattern. An insulating interlayer may be formed to cover the conductive structures on the substrate, and a top surface of the insulating interlayer may be higher than top surfaces of the conductive structures. A main contact plug may be formed through the insulating interlayer to contact the contact region, and the main contact plug may have a pillar shape and may include a first barrier pattern and a first metal pattern. The insulating interlayer adjacent to sidewall of the main contact plug may be at least partially etched to form a recess exposing an upper sidewall of the main contact plug. An extension pattern including a barrier material may be formed in the recess.

In example embodiments, the main contact plug may be formed to have a first width that is substantially the same as or smaller than a second width of the contact region.

In example embodiments, the extension pattern may be formed to have a bottom that is higher than the top surfaces of the conductive structures.

In example embodiments, each of the conductive structures may include a structure and a spacer on a sidewall of the structure, the structure may include a gate insulation pattern, a gate electrode and a hard mask sequentially stacked.

According to example embodiments, the semiconductor device may include a contact plug having a wide upper surface while having the effect of decreasing a failure due to an electrical short between the contact plug and other conductive structures. Thus, a highly integrated semiconductor device including the contact plug with an enhanced probability of failure due to electrical short may be provided.

Example embodiments relate to a contact structure that includes an insulating interlayer on a contact region of a substrate, a plurality of gate structures on the substrate, a main contact plug through the insulating interlayer and contacting the contact region of the substrate between adjacent gate structures, and a contact extension pattern surrounding an upper sidewall of the main contact plug, wherein the main contact plug does not overlap the plurality of gate structures in a direction substantially perpendicular to a surface of the substrate.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device including a contact structure, in accordance with example embodiments;

FIG. 2 is a perspective view of the contact structure in the semiconductor device;

FIGS. 3 to 13 are cross-sectional views illustrating stages of a method of manufacturing a semiconductor device, in accordance with at least one example embodiment;

FIG. 14 is a cross-sectional view illustrating a semiconductor device in accordance with example embodiments;

FIGS. 15 and 16 are cross-sectional views illustrating stages of a method of manufacturing a semiconductor device, in accordance with at least one example embodiment;

FIG. 17 is a cross-sectional view illustrating a semiconductor device including a contact structure, in accordance with example embodiments;

FIG. 18 is a perspective view of the contact structure in the semiconductor device;

FIGS. 19 to 21 are cross-sectional views illustrating stages of a method of manufacturing a semiconductor device, in accordance with example embodiments;

FIG. 22 is a cross-sectional view illustrating a semiconductor device including a contact structure in accordance with example embodiments;

FIG. 23 is a cross-sectional view illustrating a semiconductor device including a contact structure in accordance with example embodiments;

FIG. 24 is a cross-sectional view illustrating a semiconductor device including a contact structure in accordance with example embodiments;

FIGS. 25 and 26 are a perspective view and a cross-sectional view, respectively, illustrating a semiconductor device including a contact structure in accordance with example embodiments;

FIGS. 27 to 31 are cross-sectional views illustrating stages of a method of manufacturing a semiconductor device in accordance with example embodiments;

FIG. 32 is a perspective view illustrating a semiconductor device including a contact structure in accordance with example embodiments;

FIG. 33 is a block diagram illustrating a system in accordance with example embodiments;

DESCRIPTION OF EMBODIMENTS

Figure 1:
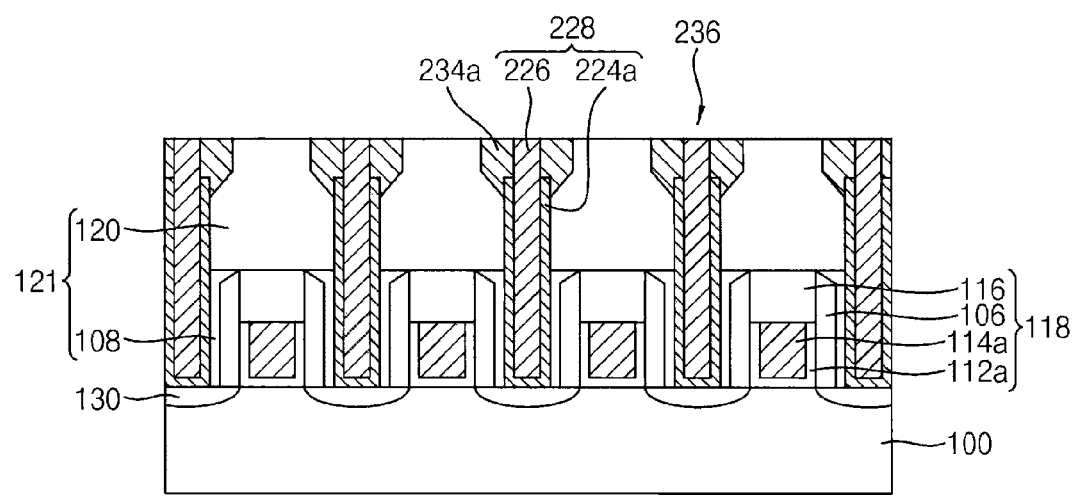
FIGS. 1 to 33 represent non-limiting, example embodiments as described herein.

Various example embodiments will be described more fully hereinafter with reference to the accompanying drawings, in which some example embodiments are shown. The example inventive concepts may, however, be embodied in many different forms and should not be construed as limited to the example embodiments set forth herein. Rather, these example embodiments are provided so that this description will be thorough and complete, and will fully convey the scope of the example inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example inventive concepts.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the example inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
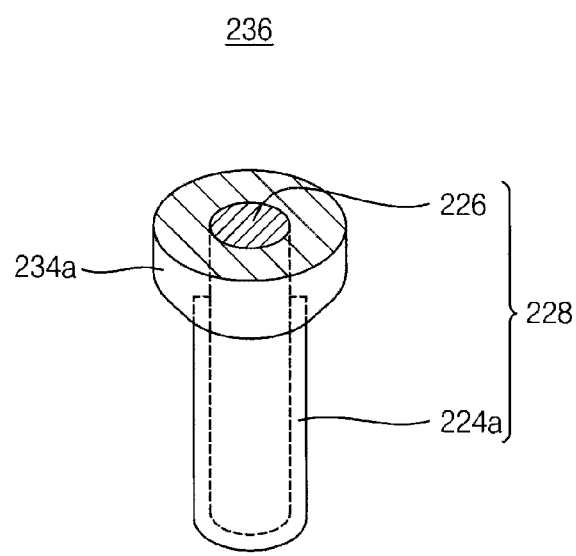

FIG. 1 is a cross-sectional view illustrating a semiconductor device including a contact structure, in accordance with example embodiments. FIG. 2 is a perspective view of the contact structure in the semiconductor device, in accordance with example embodiments.

Referring to FIGS. 1 and 2, the semiconductor device may include a plurality of gate structures 118 on a substrate 100. An insulating interlayer structure 121 may be formed on the substrate 100, and may cover the gate structures 118. Also, a contact structure 236 may be formed through the insulating interlayer structure 121.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate. The substrate 100 may have crystallinity, preferably, single crystallinity.

Each of the gate structures 118 may extend in a first direction substantially parallel to a top surface of the substrate 100. A portion of the top surface of the substrate 100 between the gate structures 118 may be or serve as a contact region that may contact the contact structure 236.

In example embodiments, each of the gate structures 236 may include a first structure and a spacer 106 on sidewalls of the first structure. The first structure may include a gate insulation pattern 112a, a gate electrode 114a and a hard mask 116 sequentially stacked.

In example embodiments, the gate insulation pattern 112a may have a single layer or a multi-layered structure. In example embodiments, the gate insulation pattern 112a may include a metal oxide having a dielectric constant that is higher than a dielectric constant of silicon oxide. The metal oxide may include, e.g., hafnium oxide, tantalum oxide, zirconium oxide, etc. For example, the gate insulation pattern 112a may include a silicon oxide pattern and a metal oxide pattern sequentially stacked on the substrate 100.

The gate insulation pattern 112a may have a U-like shape, in a cross-sectional view taken along a line extending in a second direction substantially perpendicular to the first direction. That is, the first insulation pattern 112a may cover sidewalls and a bottom of the gate electrode 114a, and may include a first portion on the top surface of the substrate 100, and second and third portions protruding from both edges of the first portion in the second direction.

The gate electrode 114a may fill a recess on the gate insulation pattern 112a. The gate electrode 114a may include a metal, e.g., tungsten (W), copper (Cu), aluminum (Al), etc.

The hard mask 116 may be formed on the gate insulation pattern 112a and the gate electrode 114a. The hard mask 116 may include a material having a high etching selectivity with respect to the insulating interlayer structure 121. In example embodiments, the hard mask 116 may include silicon nitride or silicon oxynitride.

The spacer 106 may include a material having a high etching selectivity with respect to the insulating interlayer structure 121. In example embodiments, the spacer 106 may include silicon nitride or silicon oxynitride.

Impurity regions 130 may be formed at upper portions of the substrate 100 between the gate structures 118, and may serve as source/drain regions.

A top surface of the insulating interlayer structure 121 may be substantially flat, and may be higher than a top surface of each of the gate structures 118. The insulating interlayer structure 121 may include, e.g., silicon oxide.

The contact structure 236 may include a main contact plug 228 and an extension pattern 243a surrounding an upper sidewall of the main contact plug 228.

The main contact plug 228 may penetrate through the insulating interlayer structure 121 and contact the contact region of the substrate 100. The main contact plug 228 may have a first width in the second direction that is substantially the same as or smaller than a second width of the contact region in the second direction.

Thus, the main contact plug 228 may not vertically overlap the gate structures 118, or may vertically slightly overlap the gate structures 118. When the main contact plug 228 and the gate structures 118 are substantially exactly aligned, the main contact plug 228 may not vertically overlap the gate structures 118 at all. Thus, when the main contact plug 228 is formed, sidewalls of the gate structures 118 may not be damaged, and the main contact plug 228 may not be electrically short with the gate electrodes 118.

The main contact plug 228 may include a first metal pattern 226 having a pillar shape and a first barrier pattern 224a covering a sidewall and a bottom of the first metal pattern 226. Thus, the main contact plug 228 may have a pillar shape as a whole.

A top surface of the first barrier pattern 224a may be lower than a top surface of the first metal pattern 226. That is, the first barrier pattern 224a may not cover an upper sidewall of the first metal pattern 226.

The first metal pattern 226 may include, e.g., tungsten (W), copper (Cu), aluminum (Al), etc. The first barrier pattern 224a may include, e.g., titanium (Ti), titanium nitride (TiN), tantalum (Ta), tantalum nitride (TaN), TiAlC, cobalt (Co), ruthenium (Ru), nickel (Ni), etc. The first barrier pattern 224a may have a single layer or a multi-layered structure.

In example embodiments, a top surface of the extension pattern 234a may be substantially coplanar with a top surface of the metal pattern 226. Alternatively, the top surface of the extension pattern 234a may be lower than the top surface of the first metal pattern 226.

In example embodiments, the extension pattern 234a may directly contact the upper sidewall of the first metal pattern 226, and the extension pattern 234a may have a ring shape.

A bottom of the extension pattern 234a may be higher than a top surface of each of the gate structures 118. The extension pattern 234a may vertically overlap the gate structures 118, for example, edge portions of the gate structures 118 in the second direction.

The extension pattern 234a may have a first thickness from a sidewall of the first metal pattern 226 that is greater than a second thickness of the first barrier pattern 224a from the sidewall of the first metal pattern 226. Thus, a top surface of the contact structure 236 may have an extended area due to the extension pattern 234a.

The extension pattern 234a may include a conductive material that may be used for a barrier layer. In example embodiments, the extension pattern 234a may include, e.g., titanium (Ti), titanium nitride (TiN), tantalum (Ta), tantalum nitride (TaN), TiAlC, cobalt (Co), ruthenium (Ru), nickel (Ni), etc. In example embodiments, the extension pattern 234a and the first barrier pattern 224a may include substantially the same material. Alternatively, the extension pattern 234a may include a material that is different from a material of the first barrier pattern 224a.

In some example embodiments, the extension pattern 234a may include polysilicon.

The extension pattern 234a may be formed on the upper sidewall of the main contact plug 228, and thus the top surface of the contact structure 236 may have an enlarged area. Thus, an alignment margin between the contact structure 236 and an upper wiring (not shown) thereon may increase, and the alignment margin is thus improved. Also, the misalignment between the contact structure 236 and the upper wiring may decrease.

The main contact plug 228 may have the first width in the second direction that is substantially the same as or smaller than the second width of the contact region in the second direction, so that the damage of the sidewalls of the gate structures 118 may decrease during the formation of the main contact plug 228. Thus, a short failure between the main contact plug 228 and the gate electrode 114a may decrease, resulting in with an enhanced probability of failure due to electrical short between the main contact plug 228 and the gate electrode 114a.

FIGS. 3 to 13 are cross-sectional views illustrating stages of a method of manufacturing a semiconductor device in accordance with example embodiments.

Figure 3:
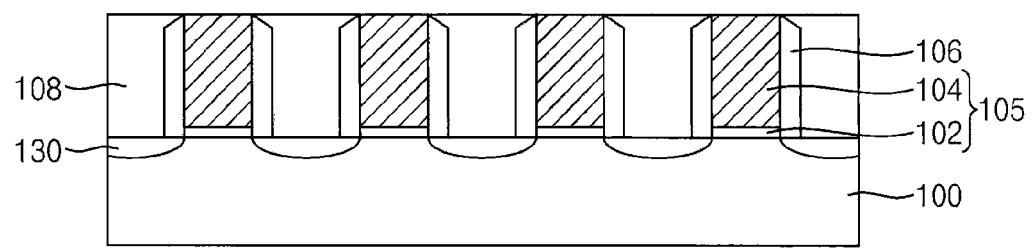

Referring to FIG. 3, a plurality of dummy gate structures 105 may be formed on a substrate 100. A spacer 106 may be formed on sidewalls of the dummy gate structures 105. A first insulating interlayer 108 may be formed on the substrate 100 to fill a gap between the dummy gate structures 105.

For example, a dummy gate insulation layer and a dummy gate electrode layer may be sequentially formed on the substrate 100. The dummy gate insulation layer may be formed of or include an oxide, e.g., silicon oxide, and the dummy gate electrode layer may be formed of or include, e.g. polysilicon.

A hard mask (not shown) or a photoresist pattern (not shown) may be formed on the dummy gate electrode layer, and the dummy gate insulation layer and the dummy gate electrode layer may be etched using the hard mask as an etching mask to form the dummy gate structures 105 each of which may include a dummy gate insulation pattern 102 and a dummy gate electrode 104 sequentially stacked. In example embodiments, after the etching process, the hard mask may be removed. Alternatively, the hard mask may not be removed after the etching process, and each of the dummy gate structures 105 may include the dummy gate insulation pattern 102, the dummy gate electrode 104 and the hard mask sequentially stacked. Each of the dummy gate structures 105 may extend in the first direction, and the dummy gate structures 105 may be spaced apart from each other in the second direction.

A spacer layer may be formed on the dummy gate structures 105 and the substrate 100. The spacer layer may be formed of or include an insulating material, e.g., silicon nitride, silicon oxide, etc., by an atomic layer deposition (ALD) process or a chemical vapor deposition (CVD). The spacer layer may be anisotropically etched to form the spacer 106 on the sidewalls of each of the dummy gate structures 105.

Impurities may be implanted into upper portions of the substrate 100 between the dummy gate structures 105 to form impurity regions 130. The impurity regions 130 may serve as source/drain regions.

A first preliminary insulating interlayer may be formed on the substrate 100 to cover the dummy gate structures 105 and the spacer 106. The preliminary first insulating interlayer may include silicon oxide. An upper portion of the preliminary first insulating interlayer may be planarized until top surfaces of the dummy gate structures 105 may be exposed to form the first insulating interlayer 108. In example embodiments, the planarization process may be performed via, for example, a chemical mechanical polishing (CMP) process and/or an etch back process.

Figure 4:
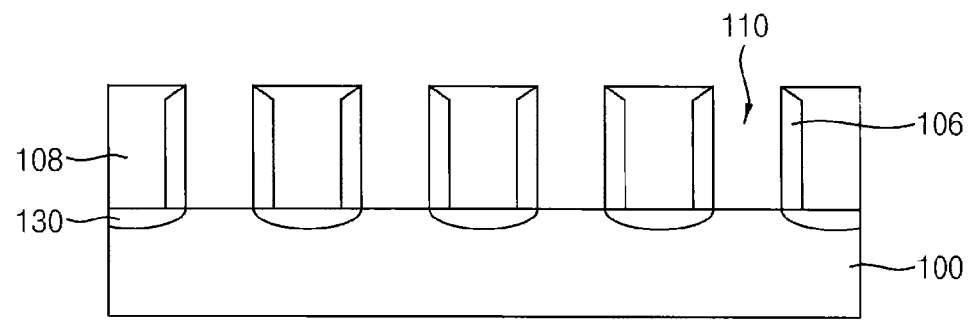

Referring to FIG. 4, the exposed dummy gate structures 105 may be removed to form first openings 110 through the first insulating interlayer 108. Each of the first openings 110 may expose a top surface of the substrate 100.

Figure 5:
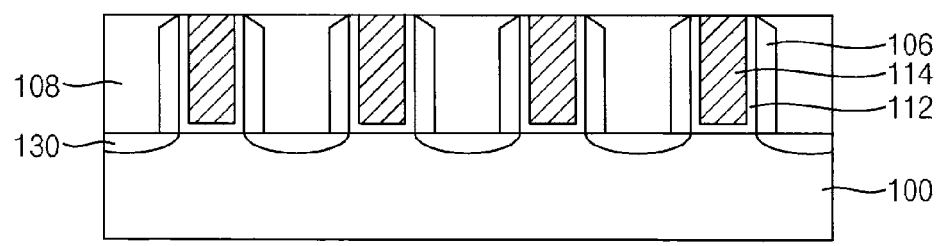

Referring to FIG. 5, a preliminary gate insulation pattern 112 and a preliminary gate electrode 114 may be sequentially formed to fill each of the first openings 110.

For example, a gate insulation layer may be conformally formed on the exposed top surface of the substrate 100, sidewalls of the first openings 110 and a top surface of the first insulating interlayer 108. The gate insulation layer may include a metal oxide having a dielectric constant higher than a dielectric constant of silicon oxide. The gate insulation layer may be formed to have a single layer or a multi-layered structure. The gate insulation layer may be formed of or include material, e.g., hafnium oxide, tantalum oxide, zirconium oxide, etc., via an ALD process, a CVD process, etc.

In some example embodiments, before forming the gate insulation layer, the exposed top surface of the substrate 100 in each of the first openings 110 may be thermally oxidized to form a thermal oxide layer (not shown).

A gate electrode layer may be formed on the gate insulation layer to fill remaining portions of the first openings 110. The gate electrode layer may be formed of or include a metal, e.g., tungsten (W), tungsten (W), copper (Cu), aluminum (Al), etc.

An upper portion of the gate electrode layer and the gate insulation layer may be planarized until the top surface of the first insulating interlayer 108 may be exposed to form the preliminary gate electrode 114 and the preliminary gate insulation pattern 112, respectively, to fill each of the first openings 110. In example embodiments, the planarization process may be performed via a CMP process and/or an etch back process.

Figure 6:
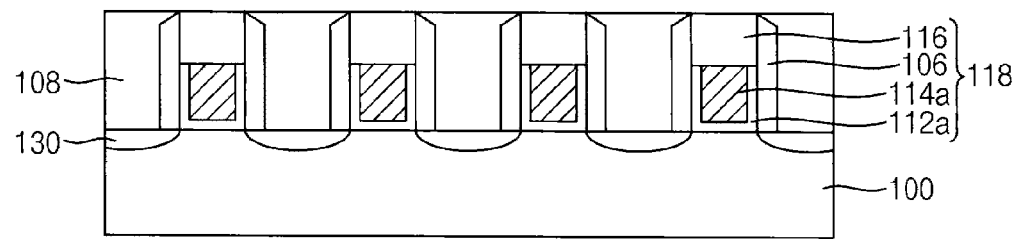

Referring to FIG. 6, the preliminary gate electrode 114 and the preliminary gate insulation pattern 112 may be partially etched to form a gate electrode 114a and a gate insulation pattern 112a, respectively, in each of the first openings 110.

That is, the gate electrode 114a may be formed on the gate insulation pattern 112a to fill a lower portion of each of the first openings 110. Preferably, metal of the preliminary gate electrode 112 may not remain in an upper portion of each of the first openings 110, however, a metal residue generated in the etching process may remain in the upper portion of each of the first openings 110. Thus, a short failure may occur due to the metal residue.

In example embodiments, a hard mask 116 may be formed on the gate electrode 114a to fill the upper portion of each of the first openings 110. For example, a hard mask layer may be formed on the gate electrode 114a, the gate insulation pattern 112a and the first insulating interlayer 108 to fill the upper portion of each of the first openings 110, and the hard mask layer may be planarized until the top surface of the first insulating interlayer 108 may be exposed to form the hard mask 116.

The hard mask 116 may be formed of or include a material having a high etching selectivity with respect to the first insulating interlayer 108. In example embodiments, the hard mask 116 may include silicon nitride or silicon oxynitride.

Thus, a plurality of gate structures 118, each of which may include a first structure and the spacer 106 on sidewalls of the first structure, may be formed. The first structure may include the gate insulation pattern 112a, the gate electrode 114a and the hard mask 116 sequentially stacked.

Figure 7:
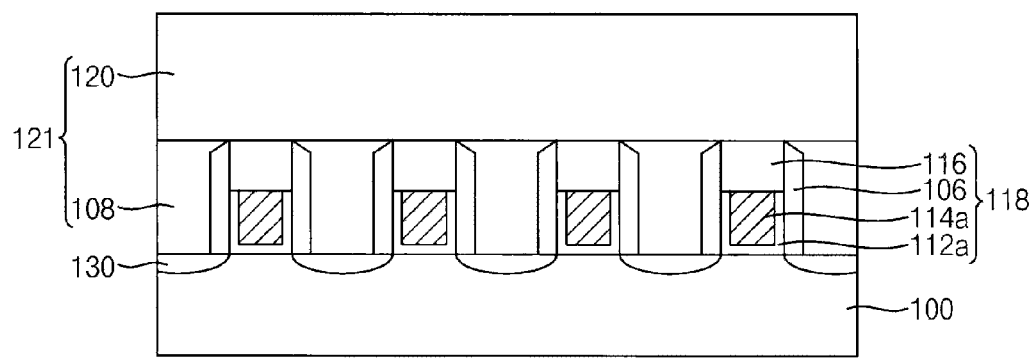

Referring to FIG. 7, a second insulating interlayer 120 may be formed on the gate structures 118 and the first insulating interlayer 108. Top surfaces of the gate structures 118 and the first insulating interlayer 108 may be substantially flat and substantially coplanar with each other, and thus the second insulating interlayer 120 may have a substantially flat top surface.

The second insulating interlayer 120 may be formed of or include, e.g., silicon oxide. In example embodiments, the second insulating interlayer 120 may include a material that is substantially the same as a material of the first insulating interlayer 108. Thus, the first and second insulating interlayers 108 and 120 may be merged into an insulating interlayer structure 121.

Figure 8:
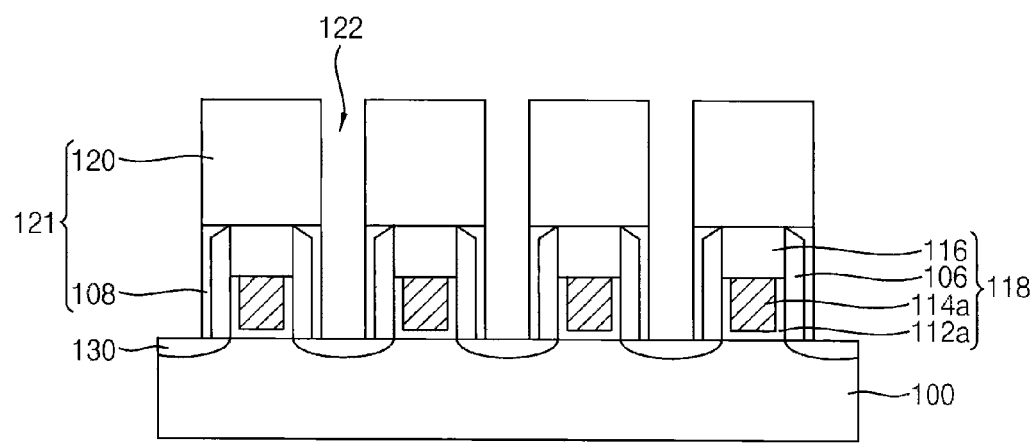

Referring to FIG. 8, an etching mask (not shown) may be formed on the insulating interlayer structure 121. The etching mask may include, e.g., a photoresist pattern.

The insulating interlayer structure 121 may be etched using the etching mask to form a first contact hole 122 exposing a contact region of the substrate 100 between the gate structures 118. The first contact hole 122 may have a sidewall having a uniform slope of about 80° to about 90°. The sidewall of the first contact hole 122 may not be bent in a horizontal direction.

The first contact hole 122 may have a first width in the second direction that is substantially the same as or smaller than a second width of the contact region in the second direction.

Thus, when the first contact hole 122 is exactly aligned to a central portion of the contact region, the first contact hole 122 may not vertically overlap the gate structures 118, for example, edge portions of the gate structures 118, in the second direction. Alternatively, the first contact hole 122 may vertically overlap the gate structures 118 slightly. In example embodiments, the first contact hole 122 and each of the gate structures 118 may be spaced apart from each other in the second direction.

Thus, during the formation of the first contact hole 122, damage on sidewalls of the gate structures 118 may be reduced, and a short failure between a main contact plug 228 (refer to FIG. 10) sequentially formed in the first contact hole 122 and the gate structures 118, which may occur because of the damage, may be reduced.

Figure 9:
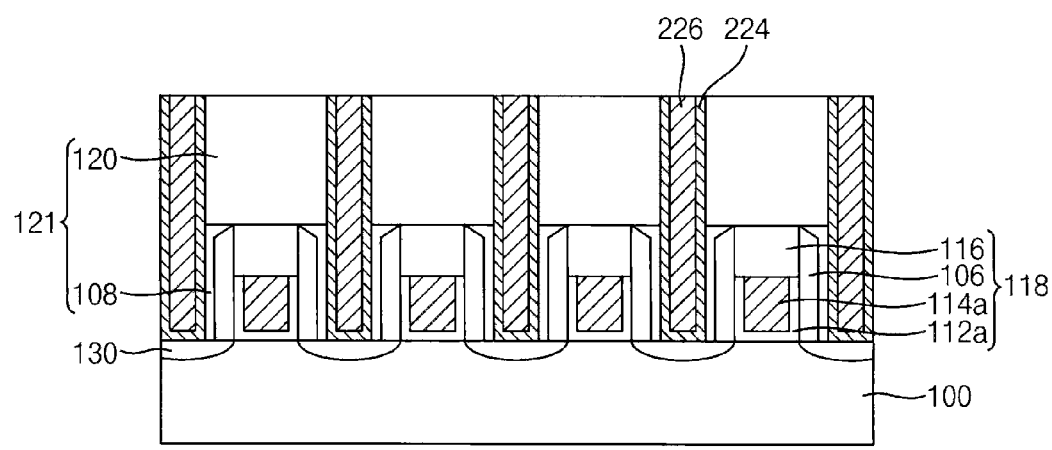

Referring to FIG. 9, a first barrier layer may be conformally formed on the exposed contact region of the substrate 100, the sidewall of the first contact hole 122 and the top surface of the insulating interlayer structure 121. A first metal layer may be formed on the first barrier layer to fill the first contact hole 122.

The first barrier layer may be formed of or include a material, e.g., titanium (Ti), titanium nitride (TiN), tantalum (Ta), tantalum nitride (TaN), TiAlC, cobalt (Co), ruthenium (Ru), nickel (Ni), etc. The barrier layer may have a single layer or a multi-layered structure.

The first metal layer may be formed of or include a material, e.g., tungsten (W), copper (Cu), aluminum (Al), etc.

The first metal layer and the first barrier layer may be planarized until the top surface of the insulating interlayer structure 121 may be exposed to form a first metal pattern 226 and a first preliminary barrier pattern 224, respectively, in the first contact hole 122. In example embodiments, the planarization process may be performed by a CMP process and/or an etch back process.

Figure 10:
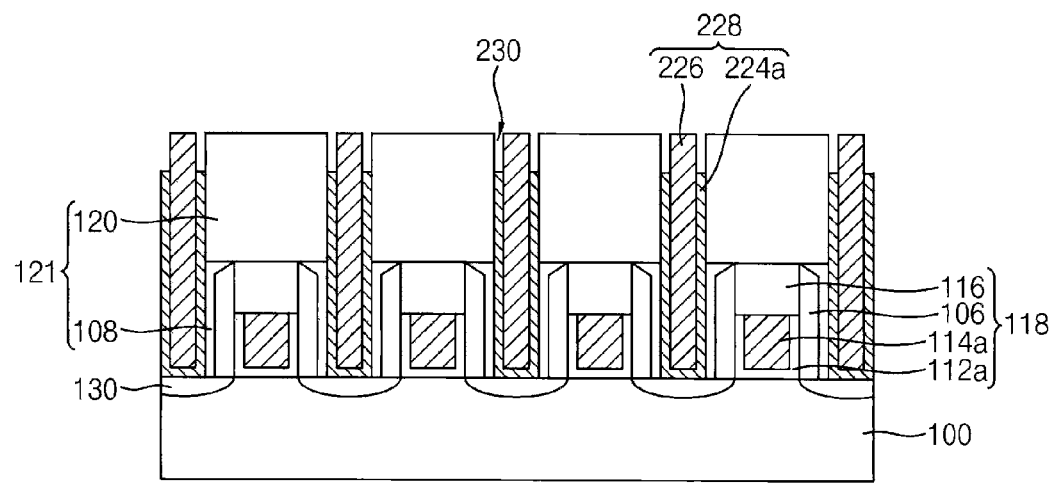

Referring to FIG. 10, the first preliminary barrier pattern 224 may be partially etched to form a first barrier pattern 224a. Thus, the main contact plug 228 including the first metal pattern 226 and the first barrier pattern 224a may be formed. A top surface of the first barrier pattern 224a may be higher than top surfaces of the gate structures 118.

A preliminary recess 230 having a ring shape may be formed by partially etching the first preliminary barrier pattern 224. The first metal pattern 226 and the insulating interlayer structure 121 may be exposed by the preliminary recess 230.

The first preliminary barrier pattern 224 may be partially etched by an anisotropic etching process or an isotropic etching process. In example embodiments, the first preliminary barrier pattern 224 may be partially etched by, for example, a dry etching process.

Figure 11:
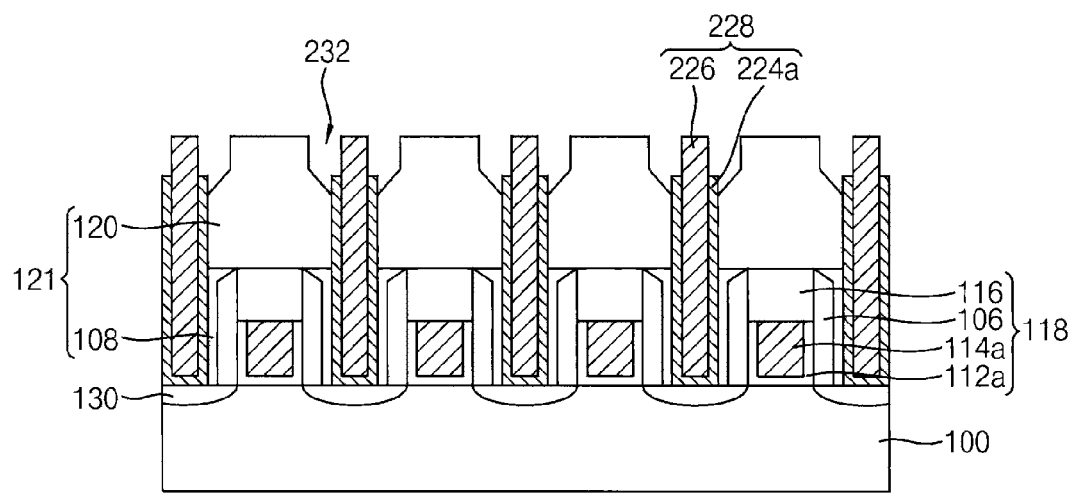

Referring to FIG. 11, a portion of the insulating interlayer structure 121 exposed by the preliminary recess 230 may be etched to form a recess 232 having a third width greater than a width of the preliminary recess 230. A bottom of the recess 232 may be higher than the top surfaces of the gate structures 118. During the etching process, an upper portion of the insulating interlayer structure 121 may also be etched.

The etching process may include an isotropic etching process. In example embodiments, the insulating interlayer structure 121 may be etched via a wet etching process using an etchant including, for example, hydrofluoric acid.

Figure 12:
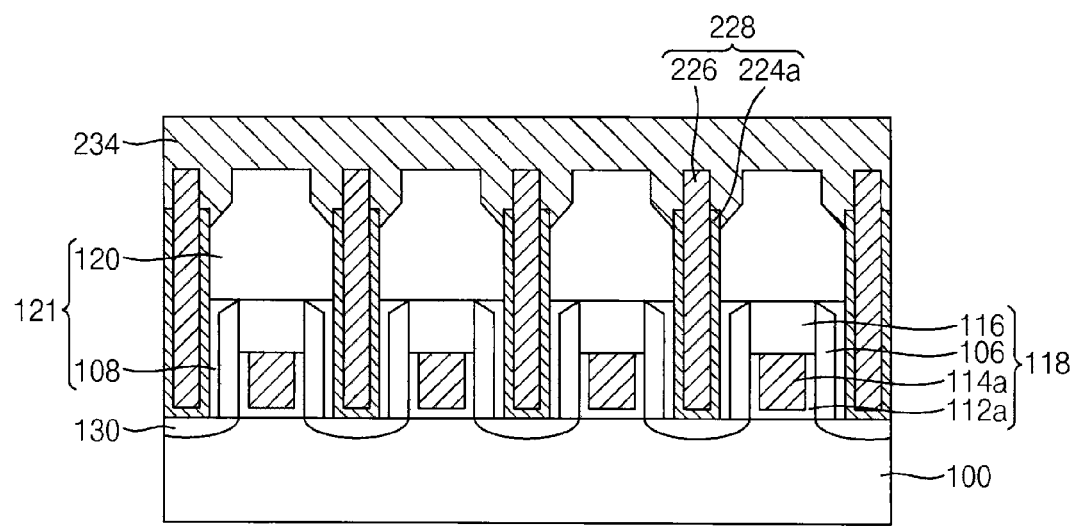

Referring to FIG. 12, a second barrier layer 234 may be formed on the insulating interlayer structure 121 to fill the recess 232.

The second barrier layer 234 may be formed of or include a material, e.g., titanium (Ti), titanium nitride (TiN), tantalum (Ta), tantalum nitride (TaN), TiAlC, cobalt (Co), ruthenium (Ru), nickel (Ni), etc. The second barrier layer 234 may have a single layer or a multi-layered structure. In example embodiments, the second barrier layer 234 may be formed of or include a material that is substantially the same as a material of the first barrier pattern 224a. Alternatively, the second barrier layer 234 may be formed of or include a material that is different from a material of the first barrier pattern 224a.

In some example embodiments, a polysilicon layer may be formed to fill the recess 232. In this case, an extension pattern 234a (refer to FIG. 13) sequentially formed may include polysilicon.

Figure 13:
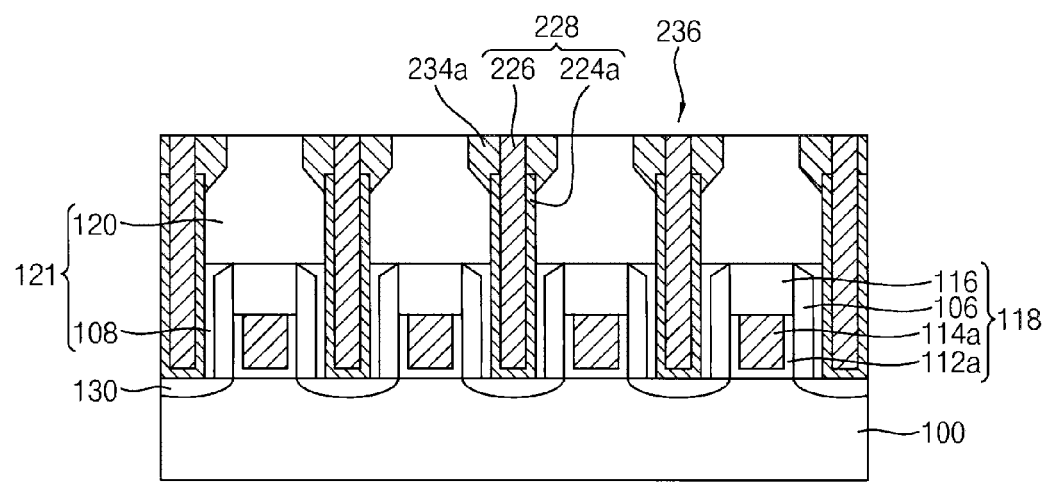

Referring to FIG. 13, the second barrier layer 234 may be planarized until the top surface of the insulating interlayer structure 121 may be exposed to form the extension pattern 234a filling the recess 232.

The extension pattern 234a may have a shape that is substantially the same as a shape of the recess 232. Thus, a bottom of the extension pattern 234a may be higher than the top surfaces of the gate structures 118. The extension pattern 234a and the gate structures 118 may be spaced apart from each other in a third direction substantially perpendicular to the top surface of the substrate 100, i.e., in a vertical direction, and may vertically overlap the gate structures 118, for example, edge portions of the gate structures 118 in the second direction. The extension pattern 234a may have a first thickness from a sidewall of the first metal pattern 226 that is greater than a second thickness of the first barrier pattern 224a from the sidewall of the first metal pattern 226.

Due to the extension pattern 234a on the sidewall of the main contact plug 225, a top surface of the contact structure 236 may have an enlarged area. Thus, an alignment margin between the contact structure 236 and an upper wiring (not shown) thereon may increase, and the alignment margin is thus improved. Also, a misalignment failure between the contact structure 236 and the upper wiring may be reduced.

The main contact plug 228 may have the first width in the second direction that is substantially the same as or smaller than the second width of the contact region in the second direction, so that damage to the sidewalls of the gate structures 118 may be reduced during the formation of the main contact plug 228. Thus, a short failure between the main contact plug 228 and the gate electrode 224a may be reduced.

Figure 14:
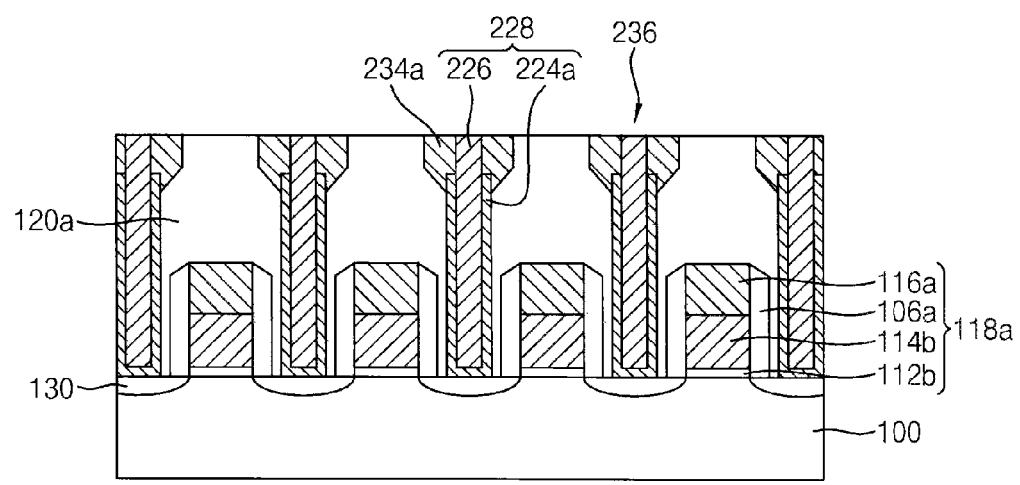

FIG. 14 is a cross-sectional view illustrating a semiconductor device in accordance with example embodiments.

The semiconductor device may be substantially the same as the semiconductor device of FIGS. 1 and 2, except for the gate structures. Thus, like reference numerals refer to like elements, and detailed descriptions thereon are omitted herein.

Referring to FIG. 14, the semiconductor device may include a plurality of gate structures 11a on the substrate 100. An insulating interlayer 120a may be formed on the substrate 100 to cover the gate structures 11a. Also, a contact structure 118a may be formed through the insulating interlayer 120a.

In example embodiments, each of the gate structures 118a may include a first structure and a spacer 106a on sidewalls of the first structure. The first structure may include a gate insulation pattern 112b, a gate electrode 114b and a hard mask 116a sequentially.

In example embodiments, the gate insulation pattern 112b may include silicon oxide, and gate electrode 114b may include doped polysilicon.

The hard mask 116a may be formed on the gate electrode 114b. The hard mask 116a may include a material having a high etching selectivity with respect to the insulating interlayer 120a. In example embodiments, the hard mask 116a may include silicon nitride or silicon oxynitride. Each of the gate insulation pattern 112b, the gate electrode 114b and the hard mask 116a may have a substantially flat top surface.

The spacer 106a may include a material having a high etching selectivity with respect to the insulating interlayer 120a. In example embodiments, the spacer 106a may include silicon nitride or silicon oxynitride.

The contact structure 228 may contact the contact region of the substrate 100 between the gate structures 118a. The contact structure 228 may be substantially the same as the contact structure illustrated with reference to FIG. 1. That is, the contact structure 228 may include the main contact plug 228 and the extension pattern 234a on the upper sidewall of the main contact plug 228. The main contact plug 228 may have a first width in the second direction that is substantially the same as or smaller than a second width in the second direction of the contact region.

Thus, an alignment margin between the contact structure 228 and an upper wiring (not shown) thereon may increase. Also, a short failure between the main contact plug 228 and the gate electrode 114b may be reduced.

Figure 15:
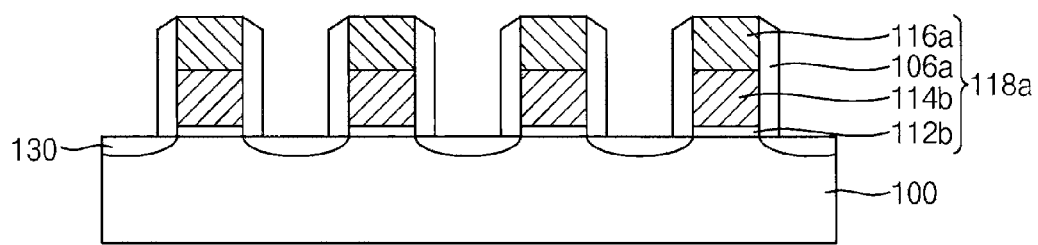
Figure 16:
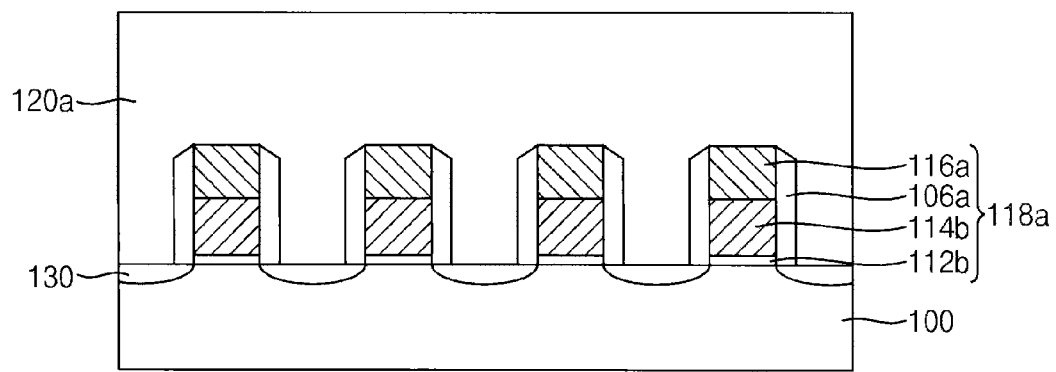

FIGS. 15 and 16 are cross-sectional views illustrating stages of a method of manufacturing a semiconductor device, in accordance with example embodiment.

Referring to FIG. 15, a gate structure 118a may be formed on the substrate 100.

For example, a gate insulation layer, a gate electrode layer and a hard mask layer may be sequentially formed on the substrate 100. The hard mask layer may be patterned to form a hard mask 116a. The gate insulation layer may be formed of or include an oxide, e.g., silicon oxide, the gate electrode layer may be formed of or include, e.g. polysilicon, and the hard mask 116a may be formed of or include, e.g. silicon nitride.

The gate electrode layer and the gate insulation layer may be etched using the hard mask 116a as an etching mask to form a plurality structures, each of which including a gate insulation pattern 112b, a gate electrode 114b and the hard mask 116a substantially stacked.

A spacer layer may be conformally formed on the structures and the substrate 100 by an ALD process or a CVD process. The spacer layer may be formed of or include an insulating material, e.g., silicon oxide, silicon nitride, etc. The spacer layer may be anisotropically etched to form a spacer 106a on sidewalls of the structures. Thus, the gate structures 118a each of which may include the gate insulation pattern 12b, the gate electrode 114b and the hard mask 116a, and the spacer 106a may be formed.

Each of the gate structures 118a may extend in the first direction, and the gate structures 118a may be spaced apart from each other in the second direction.

Impurities may be implanted into upper portions of the substrate 100 between the gate structures 118a to form impurity regions 130. The impurity regions 130 may serve as source/drain regions.

Referring to FIG. 16, an insulating interlayer 120a may be formed on the substrate 100. The insulating interlayer 120a may include silicon oxide. In example embodiments, an upper portion of the insulating interlayer 120a may be planarized, so that the insulating interlayer 120a may have a flat top surface.

For example, processes substantially the same as the processes illustrated with reference to FIGS. 8 to 13 may be performed to form the contact structure 236 (refer to FIG. 14) through the insulating interlayer 120a. Thus, the semiconductor device shown in FIG. 14 may be manufactured.

An alignment margin between the contact structure 236 and an upper wiring (not shown) thereon may increase. Also, a short failure between the main contact plug 228 and the gate electrode 114b may be reduced.

Figure 17:
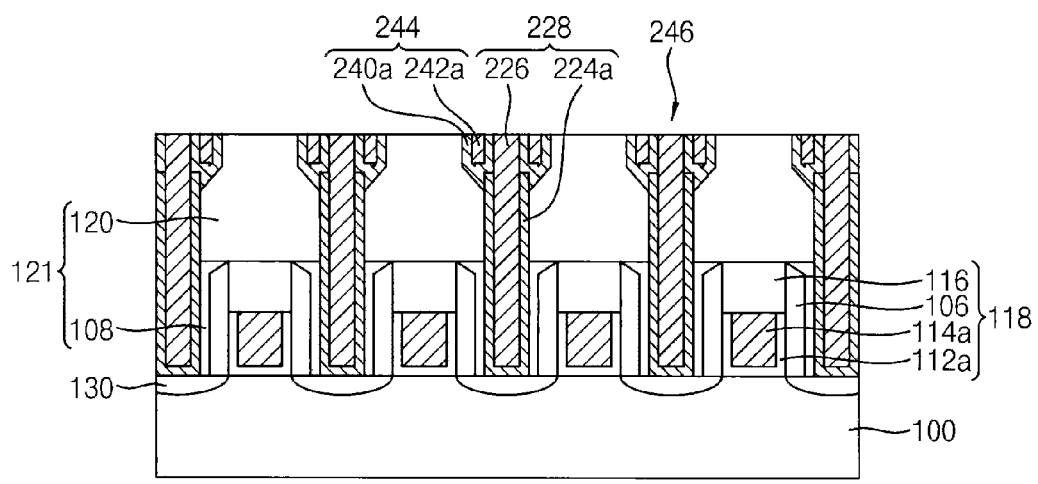
Figure 18:
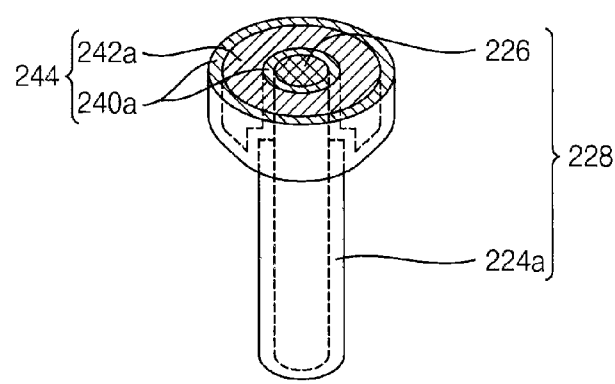

FIG. 17 is a cross-sectional view illustrating a semiconductor device including a contact structure, in accordance with example embodiments, and FIG. 18 is a perspective view of the contact structure in the semiconductor device.

The semiconductor device may be substantially the same as the semiconductor device of FIGS. 1 and 2, except for the extension pattern. Thus, like reference numerals refer to like elements, and detailed descriptions thereon are omitted herein.

Referring to FIGS. 17 and 18, the semiconductor device may include the plurality of the gate structures 118 on the substrate 100. The insulating interlayer structure 121 may be formed on the substrate 100 to cover the gate structures 118. Also, a contact structure 246 may be formed through the insulating interlayer structure 121.

The gate structures 118 and the insulating interlayer structure 121 may be substantially the same as the gate structures illustrated with reference to FIG. 1. That is, each of the gate structures 118 may include the first structure and the spacer 106 on the sidewall of the first structure. The first structure may include the gate insulation pattern 112a, the gate electrode 114a and the hard mask 116 sequentially stacked. The gate insulation pattern 112a may include a metal oxide, and the gate electrode may include a metal. The insulating interlayer structure 121 may have a substantially flat top surface.

The contact structure 246 may contact the contact region of the substrate 100 between the gate structures 118.

The contact structure 246 may include the main contact plug 228 and an extension pattern 224 surrounding an upper sidewall of the main contact plug 228.

The main contact plug 228 may be substantially the same as the main contact plug illustrated with reference to FIG. 1. That is, the main contact plug 228 may include the first metal pattern 226 having a pillar shape and the first barrier pattern 224 covering a sidewall and a bottom of the first metal pattern 226.

The extension pattern 244 may directly contact an upper sidewall of the first metal pattern 226, and may have a ring shape.

The upper sidewall of the first metal pattern 226 may be exposed by a recess, and the extension pattern 244 may fill the recess, and may have a ring shape.

The extension pattern 244 may include a second barrier pattern 240a and a second metal pattern 242a on the second barrier material pattern 240a. The second barrier pattern 240a may be conformally formed on the recess.

The second barrier pattern 240a may include, e.g., titanium (Ti), titanium nitride (TiN), tantalum (Ta), tantalum nitride (TaN), TiAlC, cobalt (Co), ruthenium (Ru), nickel (Ni), etc. In example embodiments, the second barrier pattern 240a may include a material that is substantially the same as a material of the first barrier pattern 224a. Alternatively, the second barrier pattern 240a may include a material that is different from a material of the first barrier pattern 224a.

The second metal pattern 242a may include a material that is substantially the same as a material of the first metal pattern 226. In example embodiments, the second metal pattern 242a may include, e.g., tungsten (W), copper (Cu), aluminum (Al), etc.

The main contact plug 228 may have the first width in the second direction that is substantially the same as or smaller than the second width of the contact region in the second direction between the gate structures 118. The extension pattern 244 may, for example, directly contact the upper sidewall of the main contact plug 228.

An alignment margin between the contact structure 246 and an upper wiring (not shown) thereon may increase. Also, a short failure between the main contact plug 228 and the gate electrode 114a may be reduced.

Figure 19:
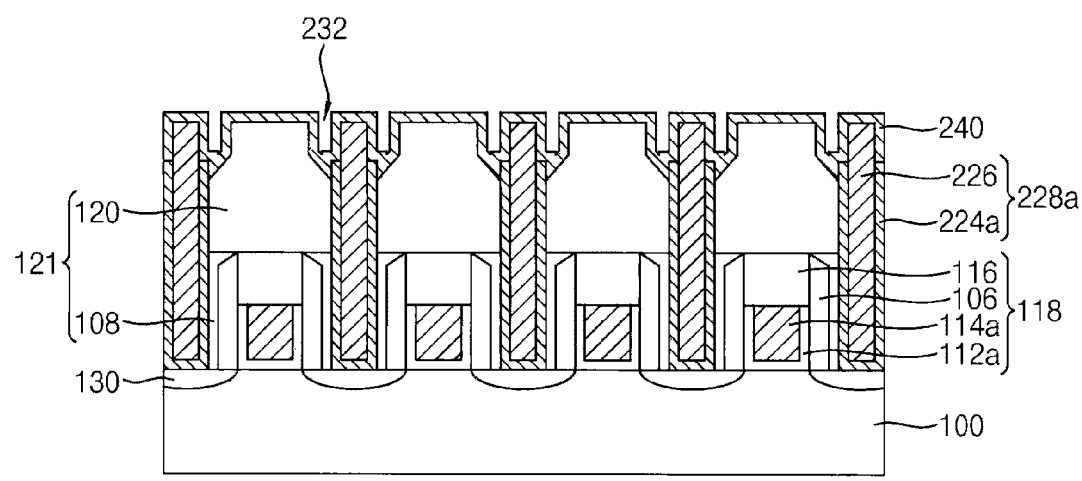
Figure 20:
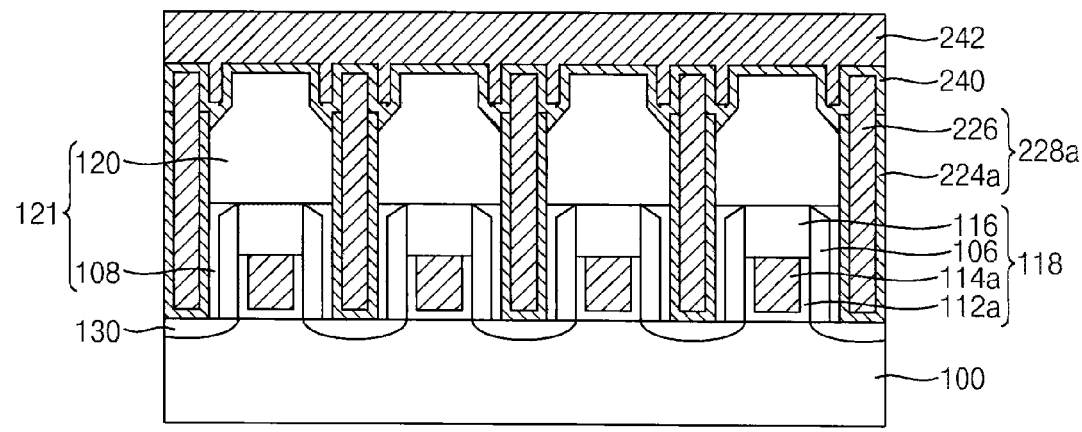
Figure 21:
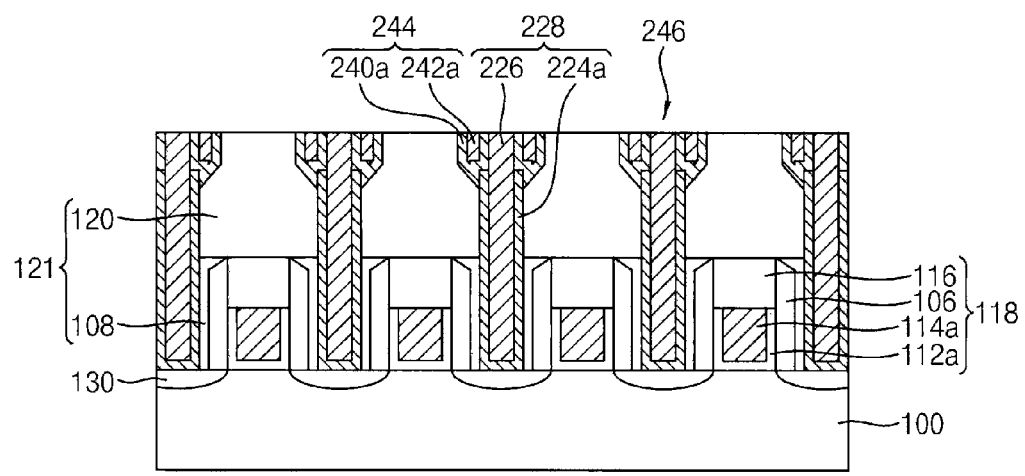

FIGS. 19 to 21 are cross-sectional views illustrating stages of a method of manufacturing a semiconductor device, in accordance with example embodiments.

First, processes substantially the same as the processes illustrated with reference to FIGS. 3 to 11 may be performed to form the main contact plug 228 and the insulating interlayer structure 121 including the recess 232 thereon. An upper sidewall of the main contact plug 228 may be exposed by the recess 232.

Referring to FIG. 19, a second barrier layer 240 may be conformally formed on surfaces of the main contact plug 228 and the insulating interlayer structure 121, which may not completely fill the recess 232. That is, the second barrier layer 240 may be conformally formed on an inner wall of the recess 232.

The second barrier layer 240 may be formed of or include a material, e.g., titanium (Ti), titanium nitride (TiN), tantalum (Ta), tantalum nitride (TaN), TiAlC, cobalt (Co), ruthenium (Ru), nickel (Ni), etc. The second barrier layer 240 may have a single layer or a multi-layered structure. In example embodiments, the second barrier layer 240 may include a material that is substantially the same as a material of the first barrier pattern 224a. Alternatively, the second barrier layer 240 may include a material that is different from a material of the first barrier pattern 224a.

Referring to FIG. 20, a second metal layer 242 may be formed on the second barrier layer 240 to fill the recess 232. The second metal layer 242 may be formed a material that is substantially the same as a material of the first metal pattern 226. The second metal layer 242 may include, e.g., tungsten (W), copper (Cu), aluminum (Al), etc.

Referring to FIG. 21, upper portions of the second metal layer 242 and the second barrier layer 240 may be planarized until a top surface of the insulating interlayer structure 121 may be exposed to form an extension pattern 244 filling the recess 232.

Thus, the contact structure 246 including the main contact plug 228 and the extension 244 may be formed.

An alignment margin between the contact structure 246 and an upper wiring (not shown) thereon may increase. Also, a short failure between the main contact plug 228 and the gate electrode 114a may be reduced.

Figure 22:
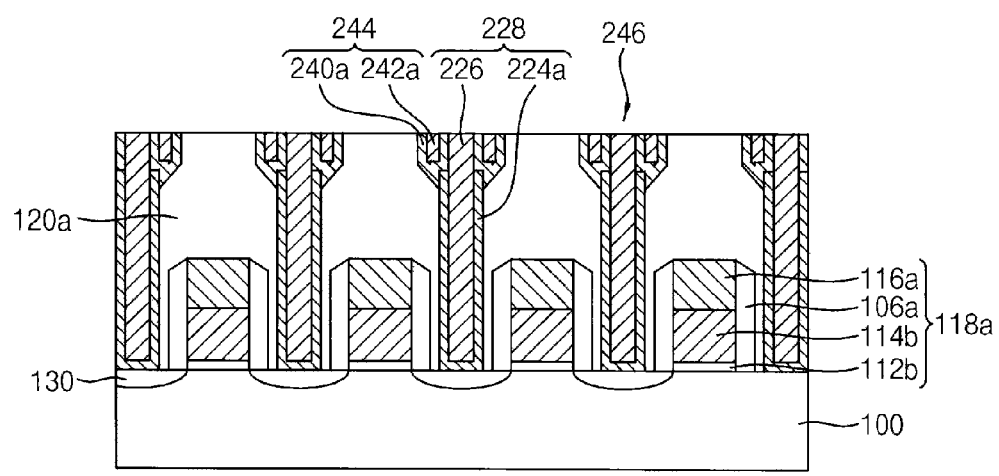

FIG. 22 is a cross-sectional view illustrating a semiconductor device including a contact structure, in accordance with example embodiments.

The semiconductor device may be substantially the same as the semiconductor device of FIGS. 17 and 18, except for the gate structure. Additionally, the gate structure of the semiconductor device may be substantially the same as the gate structure of FIG. 14. Thus, like reference numerals refer to like elements, and detailed descriptions thereon are omitted herein.

Referring to FIG. 22, the semiconductor device may include the plurality of gate structures 118a on the substrate 100. The insulating interlayer 120a may be formed on the substrate to cover the gate structures 118a.

The contact structure 246 may penetrate through the insulating interlayer 120a, and may contact the contact region of the substrate 100 between the gate structures 118a.

The contact structure 246 may include the main contact plug 228 and the extension pattern 244 on the upper sidewall of the main contact plug 228. The main contact plug 228 may have the first width in the second direction that is substantially the same as or smaller than the second width of the contact region in the second direction between the gate structures 246. The main contact plug 228 may include the first barrier pattern 224a and the first metal pattern 246. The extension pattern 244 may include the second barrier pattern 240a and the second metal pattern 242a.

An alignment margin between the contact structure 246 and an upper wiring (not shown) thereon may increase. Also, a short failure between the main contact plug 228 and the gate electrode 114b may be reduced.

An example method of manufacturing the semiconductor device shown in FIG. 22 may be described below.

In various example embodiments, processes that are substantially the same as the processes illustrated with reference to FIGS. 15 to 16 may be performed to form the gate structures 118a and the insulating interlayer 120a covering the gate structures 118a on the substrate 100. Also, processes that are substantially the same as the processes illustrated with reference to FIGS. 8 to 11 may be performed to form the main contact plug 228. Also, processes substantially the same as the processes illustrated with reference to FIGS. 19 to 21 may be performed to form the extension pattern 244 on the upper sidewall of the main contact plug 228.

The above semiconductor devices in accordance with example embodiments may further include an upper wiring (not shown) on the contact structure 246. The upper wiring may include, e.g., a via contact, a conductive line, a pad pattern, etc.

Figure 23:
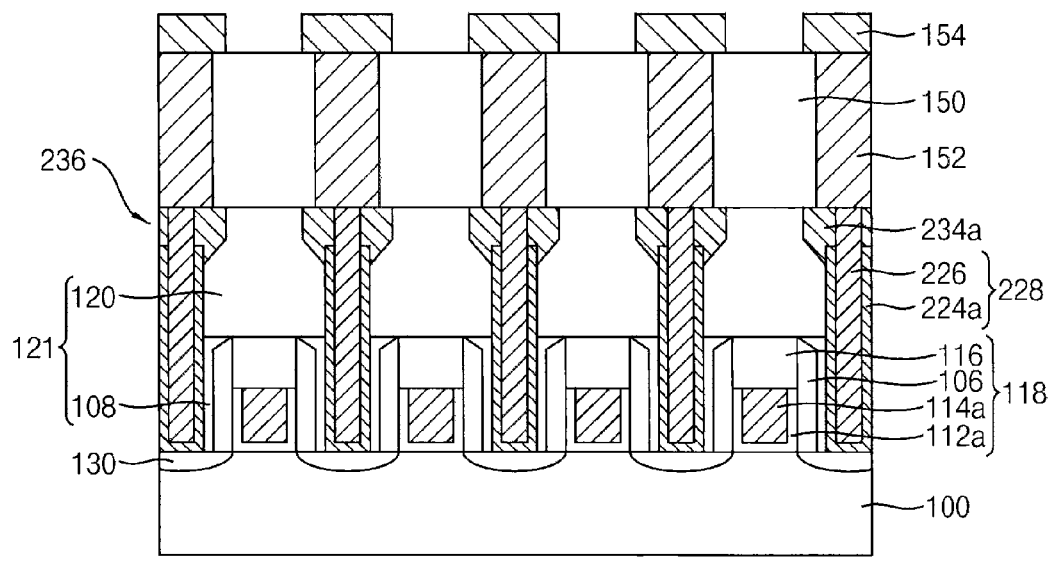

FIG. 23 is a cross-sectional view illustrating a semiconductor device including a contact structure in accordance with example embodiments.

Referring to FIG. 23, the semiconductor device may further include a via contact 152 and a metal conductive line 154 on the contact structure 236 of the semiconductor device shown in FIGS. 1 and 2.

For example, an upper insulating interlayer 150 may be formed on the contact structure 236 and the second insulating interlayer 120. The upper insulating interlayer 150 may include silicon oxide.

The via contact 152 may penetrate through the upper insulating interlayer 150, and may contact a top surface of the contact structure 236. The via contact 152 may include a barrier layer and a metal layer. The barrier layer may include, e.g., titanium (Ti), titanium nitride (TiN), tantalum (Ta), tantalum nitride (TaN), TiAlC, cobalt (Co), ruthenium (Ru), nickel (Ni), etc. The metal layer may include, e.g., tungsten (W), copper (Cu), aluminum (Al), etc.

The barrier layer may have a single layer or a multi-layered structure.

The metal conductive line 154 may be formed on the via contact 152.

Figure 24:
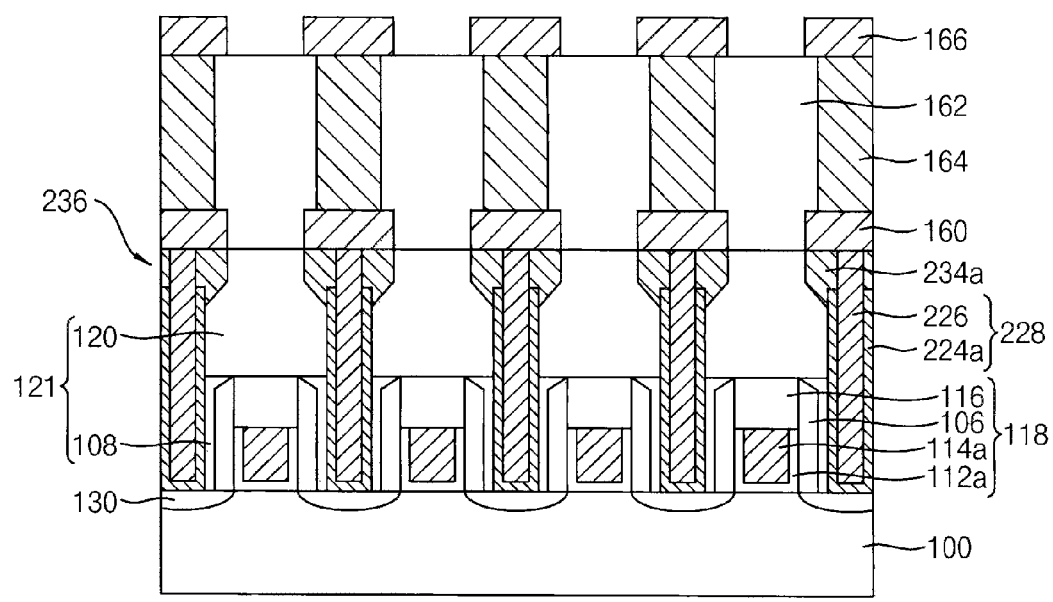

FIG. 24 is a cross-sectional view illustrating a semiconductor device including a contact structure in accordance with example embodiments.

Referring to FIG. 24, the semiconductor device may further include a pad pattern 160, a via contact 164 and a metal conductive line 166 on the contact structure 236 of the semiconductor device shown in FIGS. 1 and 2.

Referring to FIG. 24, a pad pattern 160 may be formed on the contact structure 236. The pad pattern 160 may include, e.g., a metal, a metal silicide, polysilicon, etc.

For example, an upper insulating interlayer 162 may be formed on the second insulation layer 120 and the pad pattern 160. The upper insulating interlayer 162 may include silicon oxide.

The via contact 164 may penetrate through the upper insulating interlayer 162, and may contact a top surface of the pad pattern 160. The via contact 164 may include a barrier layer and metal layer. The barrier layer may include, e.g., titanium (Ti), titanium nitride (TiN), tantalum (Ta), tantalum nitride (TaN), TiAlC, cobalt (Co), ruthenium (Ru), nickel (Ni), etc. The metal layer may include, e.g., tungsten (W), copper (Cu), aluminum (Al), etc.

The metal conductive line 166 may be formed on the via contact 164.

Figure 25:
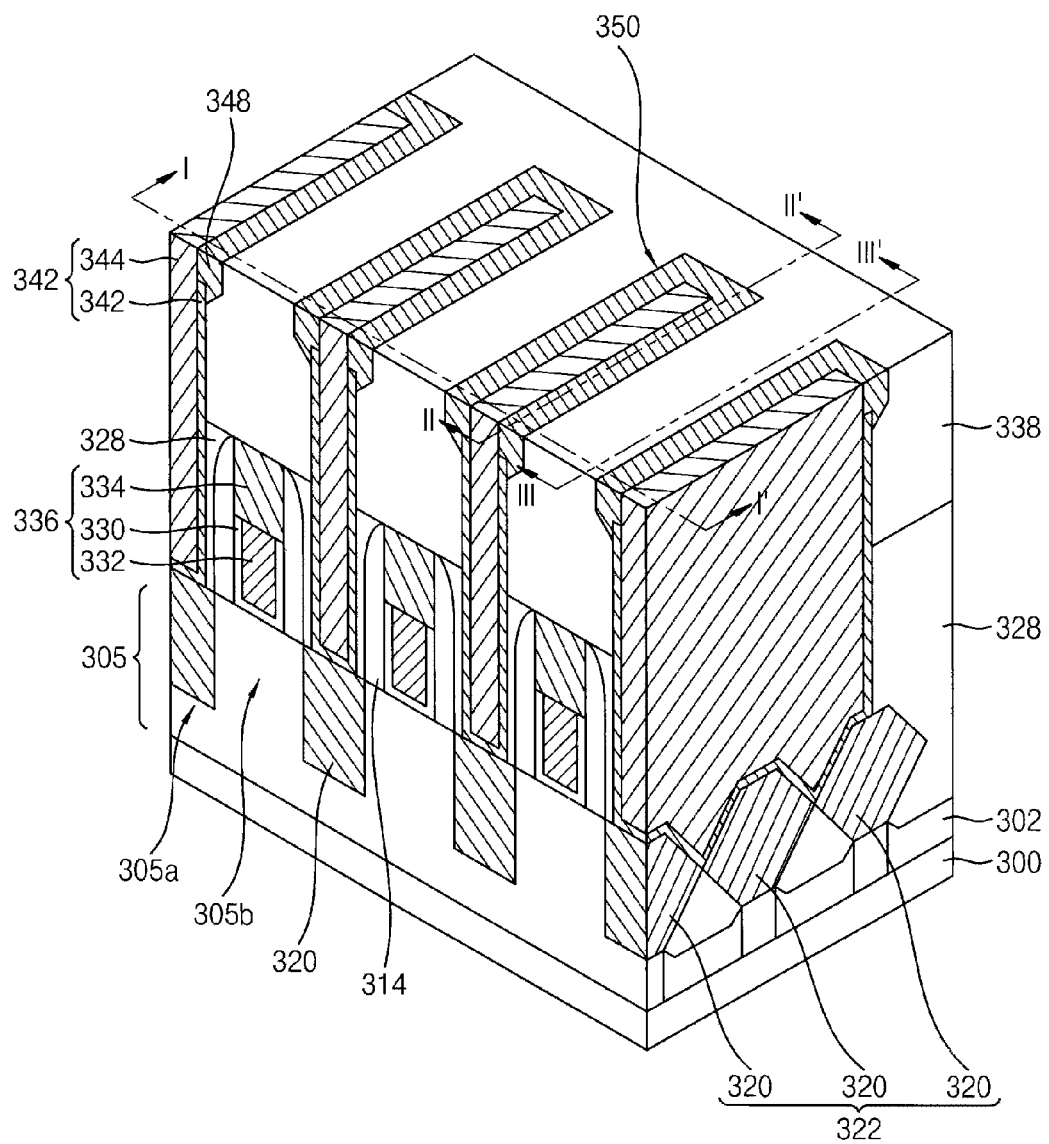
Figure 26:
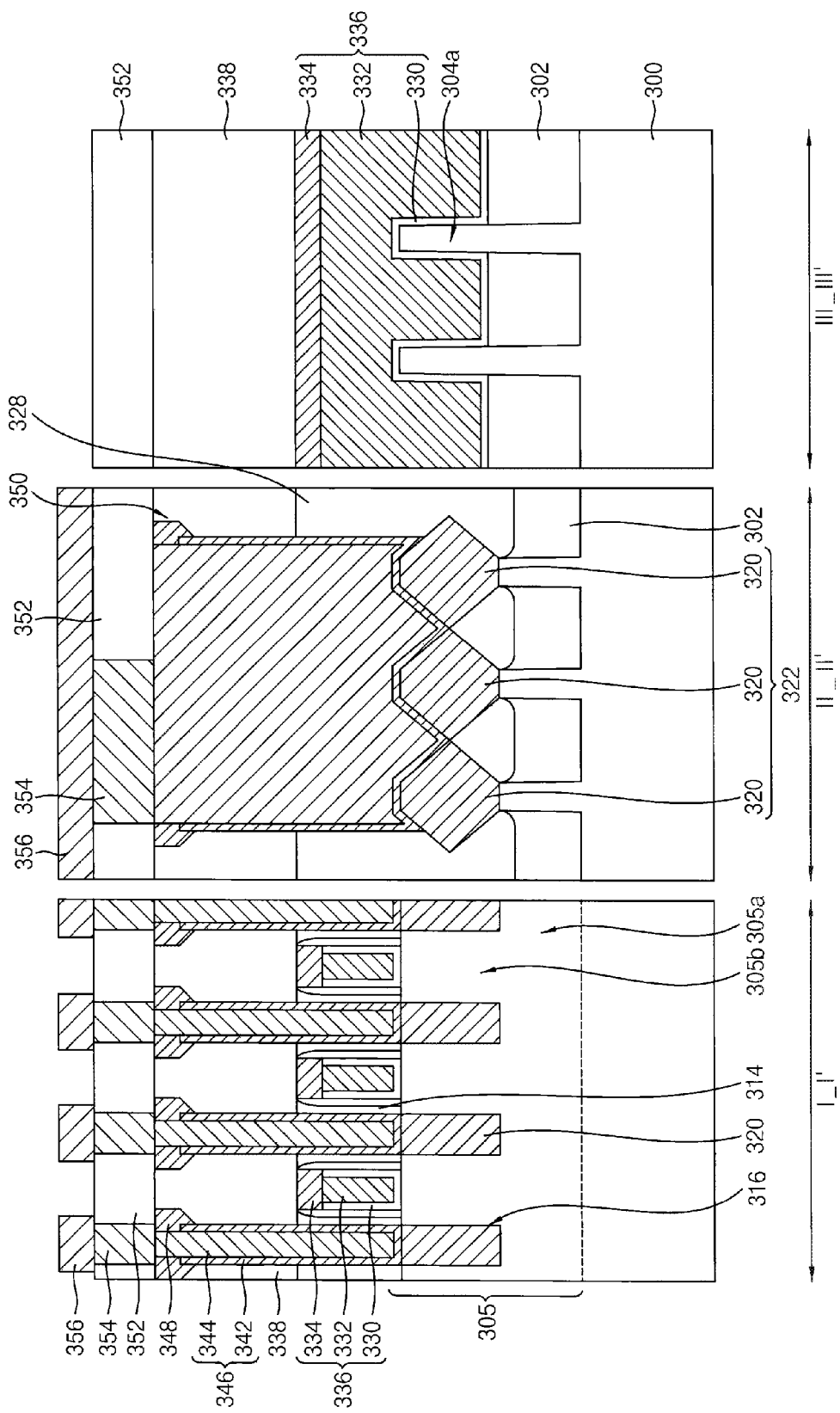

FIGS. 25 and 26 are a perspective view and a cross-sectional view, respectively, illustrating a semiconductor device including a contact structure in accordance with example embodiments. FIG. 26 includes cross-sectional views taken along lines I-I', II-II' and III-III', respectively, in FIG. 25. In FIG. 25, an upper wiring on a contact structure is omitted.

Referring to FIGS. 25 and 26, the semiconductor device may include a substrate 300, an active fin structure 305, a gate structure 336, an epitaxial structure 322 and a contact structure 350. The semiconductor device may further include an isolation layer 302 and spacers 314.

The substrate 300 may include a semiconductor material, e.g., silicon. In example embodiments, the substrate 300 may be a SOI substrate or a GOI substrate, etc. The substrate 300 may have crystallinity, such as single crystallinity.

The active fin structure 305 may include a first pattern 305a extending in a first direction and a second pattern 305b protruding upwardly from a top surface of the first pattern 305a. The active fin structure 305 may include a material that is substantially the same as the material of the substrate 300. In example embodiments, a plurality of active fin structures 305 may be arranged in a second direction that is substantially perpendicular to the first direction.

A lower portion of the second pattern 305b may be covered by the isolation layer 302, and an upper portion thereof may not be covered by the isolation layer 302. The upper portion of the second pattern 305b may serve as an active region, and thus may be referred to as an active fin 304a. That is, the active fin 304a may be disposed to be higher than a top surface of the isolation layer 302 under the gate structure 336.

In example embodiments, a plurality of second patterns 305b may be formed in the first direction, and a recess 316 may be formed between the plurality of second patterns 305b in the first direction. A bottom of the recess 316 may be lower than the top surface of the isolation layer 302 under the gate structure 336.

In example embodiments, the active fin 304a may have a pillar shape, and a length of the active fin 304a in the first direction may be greater than a length thereof in the second direction. In example embodiments, a plurality of active fins 304a may be arranged both in the first and second directions, respectively.

The isolation layer 302 may include an oxide, e.g., silicon oxide.

In example embodiments, the gate structure 336 may extend in the second direction, and cover a top surface and a sidewall of the active fin 304a, and a plurality of gate structures 336 may be formed in the first direction.

In example embodiments, the gate structure 336 may include a gate insulation pattern 330, a gate electrode 332 and a hard mask 334 sequentially stacked on the active fin 304a and the isolation layer 302.

The gate insulation pattern 330 may include an oxide, e.g., silicon oxide, or a metal oxide having a high dielectric constant, e.g., hafnium oxide, tantalum oxide, zirconium oxide, etc. In one example, the gate insulation pattern 330 may include a silicon oxide layer and a metal oxide layer sequentially stacked.

The gate electrode 332 may include a material having a low resistance, e.g., a metal such as aluminum, copper, tantalum, etc., or a metal nitride thereof. Alternatively, the gate electrode 332 may include, e.g., polysilicon. The hard mask 334 may include a nitride, e.g., silicon nitride.

The spacers 314 may be formed on sidewalls of the gate structure 336, and may include a nitride, e.g., silicon nitride, silicon oxycarbonitride (SiOCN), etc.

An epitaxial pattern 320 may be formed in the recess 316 on a portion of the active fin 304a between the gate structures 336. The epitaxial pattern 320 may protrude from the portion of the active fin 304a in the recess 316 in the second direction (e.g., laterally). In example embodiments, the epitaxial pattern 320 may have a cross-section taken along the second direction of which a shape may be pentagon, hexagon, or rhombus.

In example embodiments, a plurality of epitaxial patterns 320 disposed in the second direction may be connected to each other to be merged into a single pattern, which may be referred to as the epitaxial structure 322, according as the epitaxial patterns 320 may protrude in the second direction. The epitaxial structure 322 may serve as a source/drain region of the FinFET, and may be doped with impurities.

In example embodiments, the epitaxial pattern 320 may include silicon or silicon germanium. When the FinFET is a negative-channel metal oxide semiconductor (NMOS) transistor, the epitaxial pattern 320 may include silicon doped with n-type impurities. When the FinFET has a positive-channel metal oxide semiconductor (PMOS) transistor, the epitaxial pattern 320 may include silicon germanium doped with p-type impurities.

In some example embodiments, the active fin structure 305 may not include the recess 316 and the epitaxial pattern 320.

Insulating interlayers 328 and 338 may cover the gate structures 336. In example embodiments, a plurality of insulating interlayers 328 and 338 may be stacked on the substrate 300. In one example, a first insulating interlayer 328 may fill a gap between the gate structures 336, and a second insulating interlayer 338 may be formed on the first insulating interlayer 328. The first and second insulating interlayers 328 and 338 may include substantially the same material, e.g., silicon oxide.

The contact structure 350 may be formed through the first and second insulating interlayers 328 and 338, and may contact an upper surface of the epitaxial structure 322. In example embodiments, a bottom of the contact structure 350 may contact most of the upper surface of epitaxial structure 322. Thus, the contact structure 350 may extend in the second direction.

The contact structure 350 may include the main contact plug 346 and the contact extension pattern 348 surrounding an upper sidewall of the main contact plug 346.

In example embodiments, the contact structure 350 may have a cross-section taken along the first direction of which a shape substantially the same as the shape illustrated with reference to FIG. 1. Alternatively, the contact structure 350 may have a cross-section taken along the first direction of which a shape substantially the same as the shape illustrated with reference to FIG. 17.

An upper insulating interlayer 352 may be formed on the contact structure 350 and the second insulating interlayer 338. The upper insulating interlayer 352 may include, e.g., silicon oxide.

A via contact 354 may be formed through the upper insulating interlayer 352, and may contact a top surface of the contact structure 350. The via contact 354 may include a metal. In example embodiments, the via contact 354 may include a barrier layer and a metal layer. In example embodiments, the metal layer may include, e.g., tungsten (W), copper (Cu), aluminum (Al), etc., and the barrier layer may include, e.g., titanium (Ti), titanium nitride (TiN), tantalum (Ta), tantalum nitride (TaN), TiAlC, cobalt (Co), ruthenium (Ru), nickel (Ni), etc.

A metal conductive line 356 may be formed on the via contact 354.

As described above, the contact structure 350 may have a wide top surface so that an alignment margin between the via contact 354 and the contact structure 350 may increase. Also, a short failure between the contact structure 350 and each of the gate structures 336 may be reduced.

FIGS. 27 to 31 are cross-sectional views illustrating stages of a method of manufacturing a semiconductor device in accordance with example embodiments.

For example, FIGS. 27 to 31 include cross-sectional views taken along lines I-I', II-II' and III-III' of FIG. 25.

Figure 27:
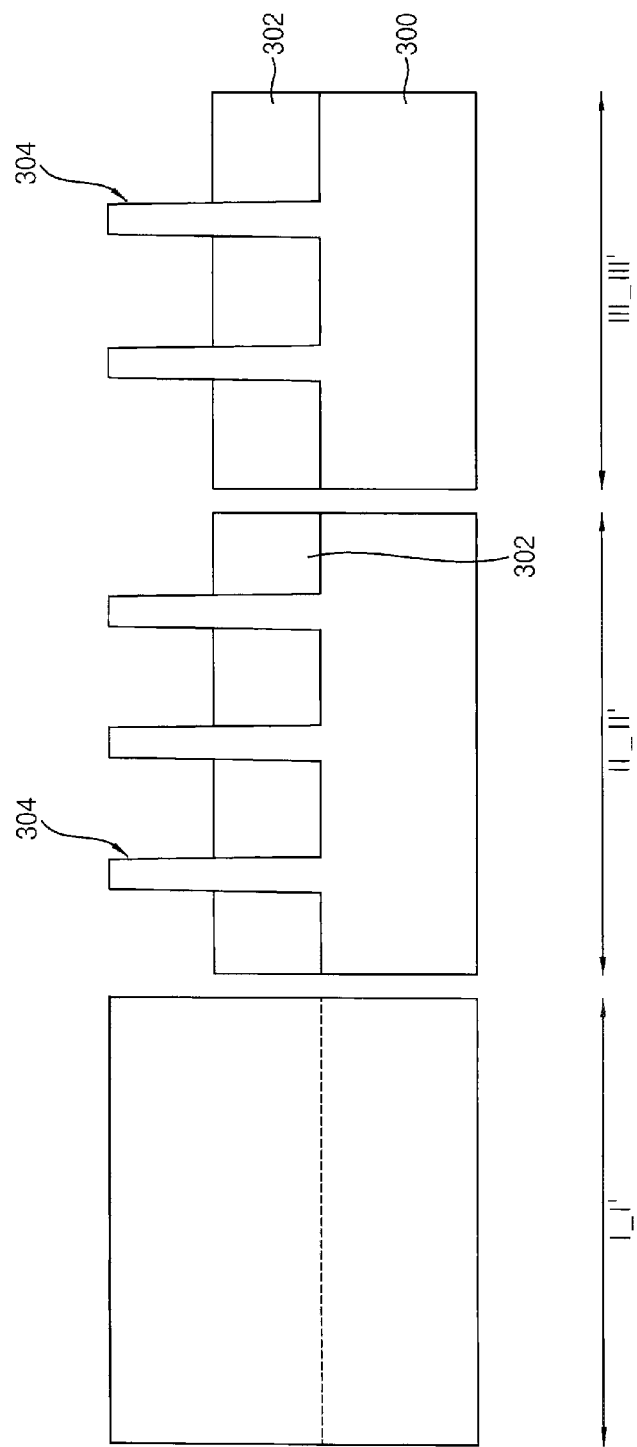

Referring to FIG. 27, an upper portion of a substrate 300 may be partially removed to form a trench extending in a first direction, and an isolation layer 302 may be formed on the substrate 300 to fill a lower portion of the trench.

Before forming the trench, impurities may be implanted into the substrate 300 to form a well region.

In example embodiments, the isolation layer 302 may be formed by forming an insulation layer on the substrate 300 to sufficiently fill the trench, planarizing the insulation layer until a top surface of the substrate 300 may be exposed, and removing an upper portion of the insulation layer to expose an upper portion of the trench. The insulation layer may be formed to include an oxide, e.g., silicon oxide.

Accordingly, as the isolation layer 302 is formed, a plurality of preliminary active fins 304 may be formed on the substrate 300 to extend in the first direction. In example embodiments, the preliminary active fins 304 may be arranged in a second direction substantially perpendicular to the first direction.

Figure 28:
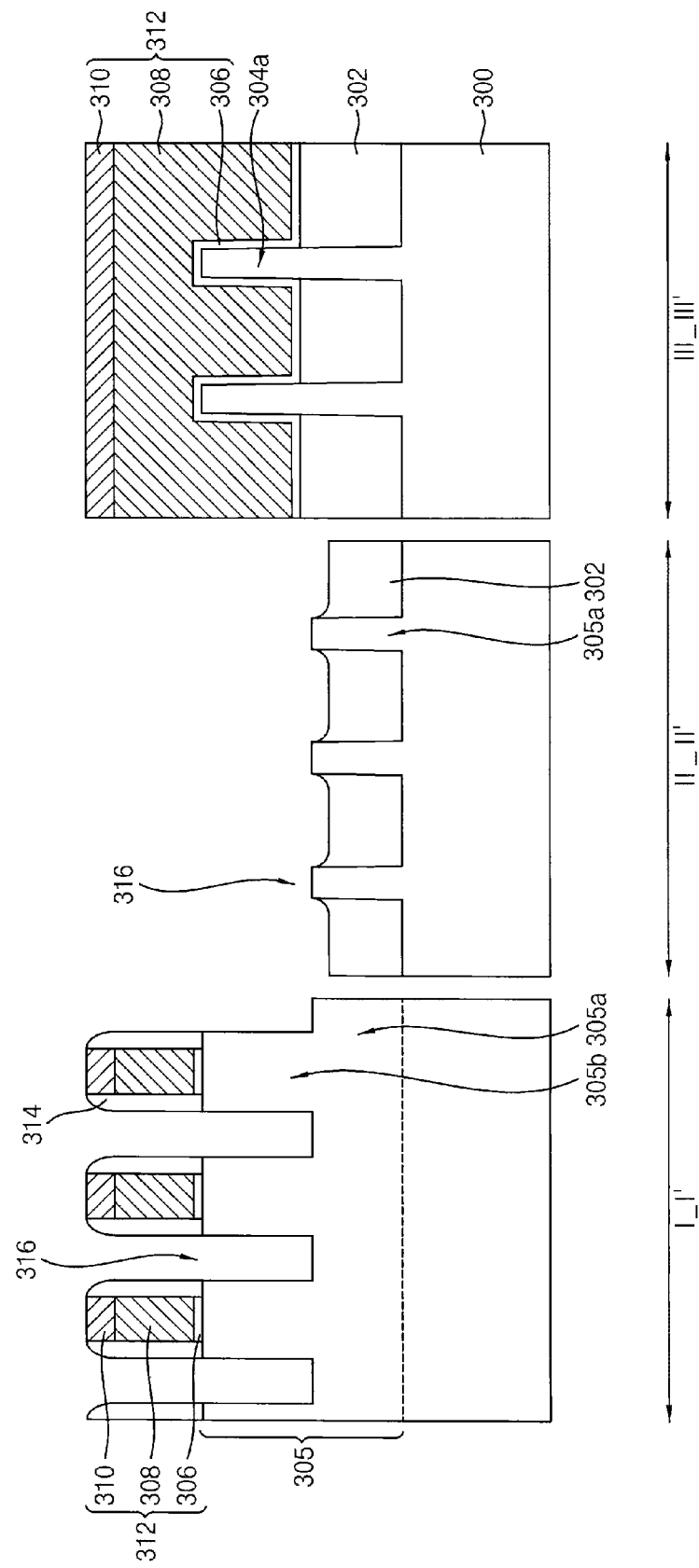

Referring to FIG. 28, a plurality of dummy gate structures 312 may be formed on the substrate 300. Spacers 314 may be formed on sidewalls of each of the dummy gate structures 312. An upper portion of the preliminary active fins 304 may be etched to form a recess 316 between the spacers 314.

For example, the dummy gate structures 312 may be formed by sequentially stacking a dummy insulation layer, a dummy gate electrode layer and a hard mask layer on the preliminary active fins 304 and the isolation layer 302, patterning the hard mask layer by a photolithography process using a photoresist pattern to form a hard mask 310, and sequentially etching the dummy gate electrode layer and the dummy insulation layer using the hard mask 310 as an etching mask. Thus, each of the dummy gate structures 312 may be formed to include a dummy insulation pattern 306, a dummy gate electrode 308 and the hard mask 310 sequentially stacked.

The dummy insulation layer may be formed to include an oxide, e.g., silicon oxide, the dummy gate electrode layer may be formed to include, e.g., polysilicon, and the hard mask layer may be formed to include a nitride, e.g., silicon nitride. The dummy insulation layer may be formed by a CVD process, an ALD process, etc. Alternatively, the dummy insulation layer may be formed by a thermal oxidation process on an upper portion of the substrate 100. The dummy gate electrode layer and the hard mask layer may be also formed by a CVD process, an ALD process, etc.

In example embodiments, each of the dummy gate structures 312 may be formed to extend in the second direction on the preliminary active fins 304 and the isolation layer 302, and the plurality of dummy gate structures 312 may be formed at a given, or alternatively desired distance from each other in the first direction.

A spacer layer may be formed on the dummy gate structures 312, the preliminary active fins 304 and the isolation layer 302. The spacer layer may be anisotropically etched to form the spacers 314 on sidewalls of each of the dummy gate structures 312.

The preliminary active fin 304 may be partially removed using the dummy gate structures 312 and the spacers 314 as an etch mask to form the recess 316. Thus, an active fin structure 305 may be formed to include a first pattern 305a extending in the first direction and a second pattern 305b protruding from a top surface of the first pattern 305a.

In example embodiments, the etching processes for forming the spacers 314 and the recess 316 may be performed in-situ.

Figure 29:
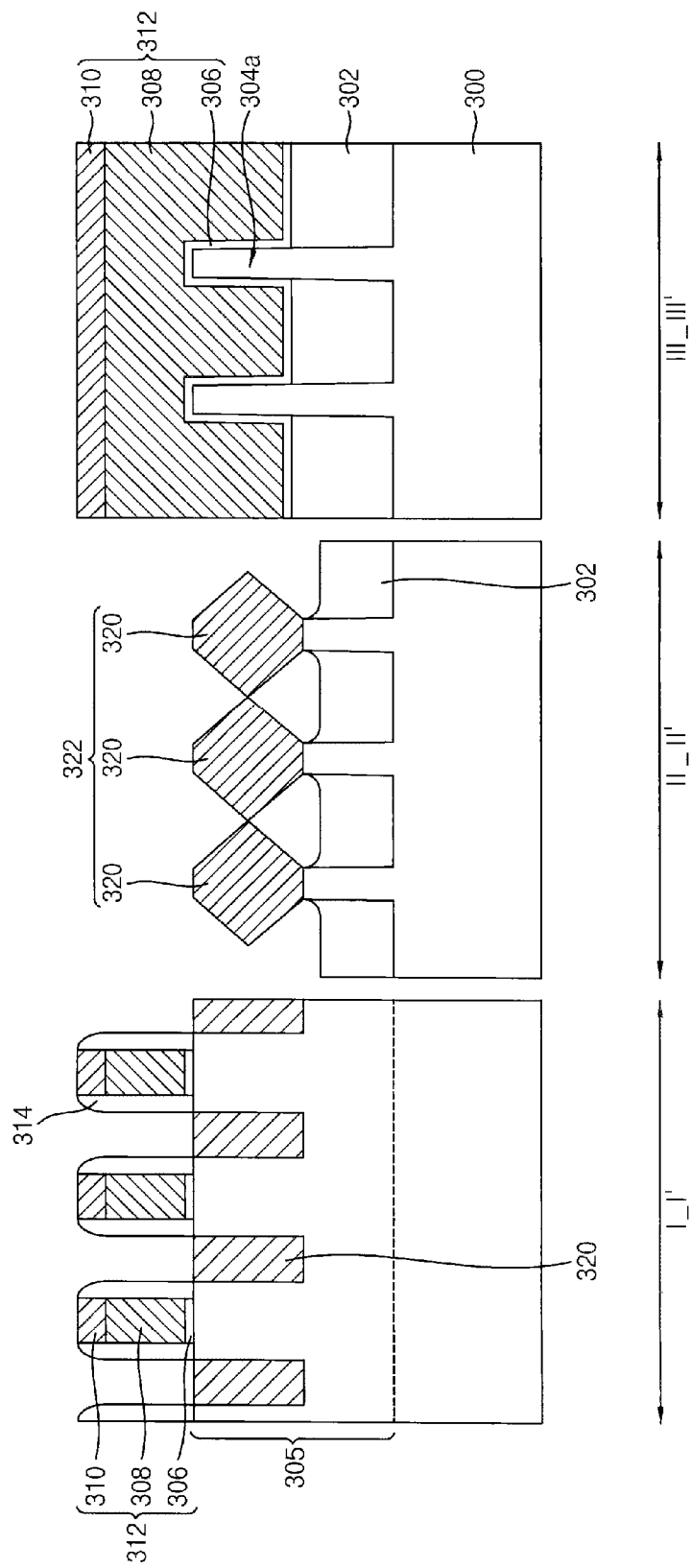

Referring to FIG. 29, an epitaxial pattern 320 may be formed to fill the recess 316. In example embodiments, a plurality of epitaxial patterns 320 may be formed in the second direction. Sidewalls of the epitaxial patterns 320 in the second direction may contact each other to be merged into a single layer, which may referred to as an epitaxial structure 322.

In example embodiments, a selective epitaxial growth (SEG) process may be performed using a surface portion of the active fin structure 305 exposed by the recess 316 as a seed to form the epitaxial patterns 320.

The epitaxial patterns 320 may be grown not only in a vertical direction but also in a horizontal direction, and thus each of the epitaxial patterns 320 may be formed to have a cross-section taken along the second direction of which a shape may be pentagon, hexagon, or rhombus. In example embodiments, the plurality of epitaxial patterns 320 formed in the second direction may be grown to be merged into a single layer, and thus the plurality of epitaxial patterns 320 may contact each other.

In example embodiments, when the SEG process is performed, impurities may be doped in-situ into the epitaxial patterns 320. Thus, the epitaxial structure 322 including the epitaxial patterns 320 may serve as a source/drain region of a FinFET.

In example embodiments, each of the epitaxial patterns 320 may be formed to include silicon, silicon germanium or SiC. When a PMOS transistor is formed, the epitaxial patterns 320 may be formed to include silicon germanium, and may be doped with p-type impurities. Alternatively, when an NMOS transistor is formed, the epitaxial patterns 320 may be formed to include silicon or SiC, and may be doped with n-type impurities.

In example embodiments, after performing the SEG process, impurities may be further implanted into the active fin structure 305, and the substrate 300 may be annealed.

Figure 30:
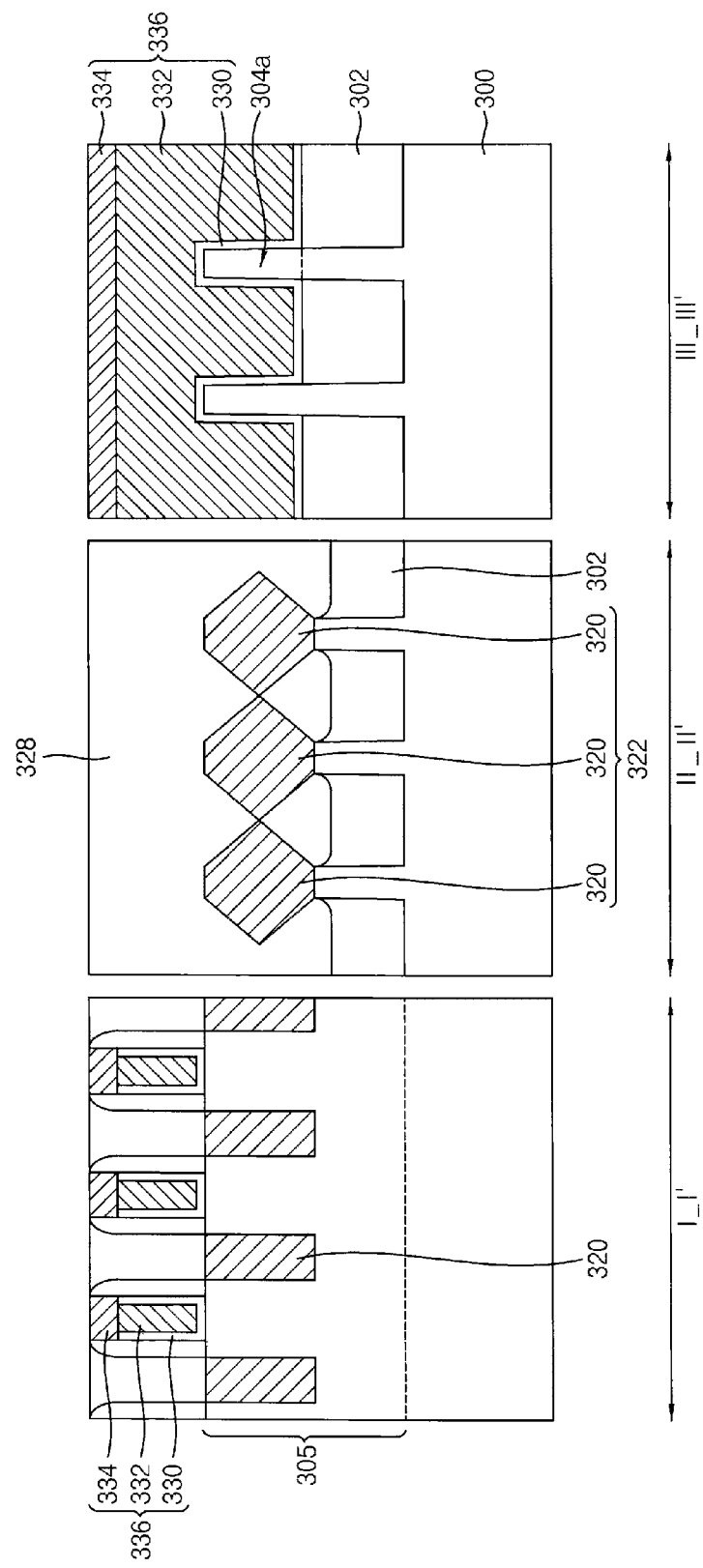

Referring to FIG. 30, a first insulating interlayer 328 covering the dummy gate structures 312, the spacers 314, the epitaxial structure 322 and the isolation layer 302 may be formed on the substrate 300, and an upper portion of the first insulating interlayer 328 may be planarized until top surfaces of the dummy gate structures 312 may be exposed. The exposed dummy gate structures 312 may be removed to form openings exposing top surfaces of the active fin 304a and the isolation layer 302. A gate structure 336 may be formed to fill each of the openings.

In example embodiments, the first insulating interlayer 328 may be formed to include, e.g., silicon oxide. In example embodiments, the planarization process may be performed via a chemical mechanical polishing (CMP) process and/or an etch back process.

In example embodiments, the exposed top surface of the active fin 304a may be, e.g., thermally oxidized to form a thermal oxide layer.

The gate structure 336 may include a gate insulation pattern 330, a gate electrode 332 and a hard mask 334 sequentially stacked.

For example, a high-k dielectric layer may be formed on top surfaces of the thermal oxide layer and the isolation layer 302, sidewalls of the openings, and a top surface of the first insulating interlayer 328, and a gate electrode layer may be formed on the high-k dielectric layer to fill remaining portions of the openings.

The high-k dielectric layer may be formed to include a metal oxide having a high dielectric constant, e.g., hafnium oxide, tantalum oxide, zirconium oxide, etc. The gate electrode layer may be formed to include a material having a low resistance, e.g., a metal such as aluminum, copper, tantalum, etc., or a metal nitride thereof by an ALD process, a physical vapor deposition (PVD) process, etc.

In example embodiments, the gate electrode layer and the high-k dielectric layer may be planarized until the top surface of the first insulating interlayer 328 may be exposed, and the gate electrode layer filling each of the openings may be partially etched to form the gate insulation pattern 330 on the top surfaces of the thermal oxide layer and the isolation layer 302, and the sidewalls of the openings, and the gate electrode 332 filling a lower portion of each of the openings on the gate insulation pattern 330. In example embodiments, the planarization process may be performed via a CMP process and/or an etch back process. A hard mask layer may be formed on the gate electrode 332 and the gate insulation pattern 330 to fill a remaining portion of each of the openings, and the hard mask layer may be planarized until the top surface of the first insulating interlayer 328 may be exposed to form the hard mask 334.

Thus, the gate insulation pattern 330, the gate electrode 332 and the hard mask 334 sequentially stacked may form the gate structure 336.

Figure 31:
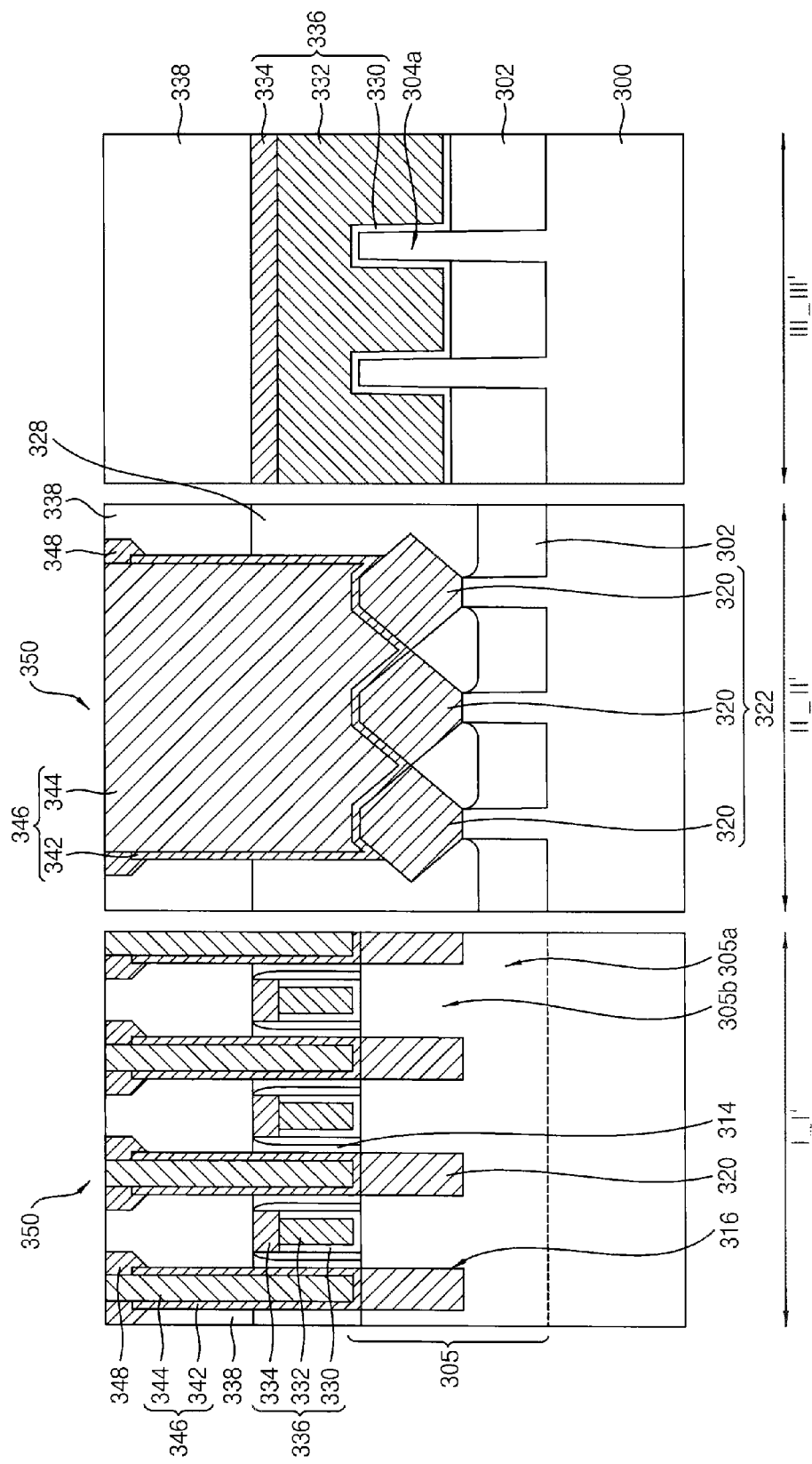

Referring to FIG. 31, a second insulating interlayer 338 may be formed on the first insulating interlayer 328. A contact structure 350 may be formed through the second insulating interlayers 328 and 338, and may contact the upper surface of the epitaxial pattern 320. The contact structure 350 may include a main contact plug 346 and a contact extension pattern 348 surrounding an upper sidewall of the main contact plug 228.

In example embodiments, the contact structure 350 may have a cross-section taken along the first direction of which a shape substantially the same as the shape illustrated with reference to FIG. 1. In this case, the contact structure 350 may be formed by processes that are similar to or the same as the processes illustrated with reference to FIGS. 8 to 11.

Alternatively, the contact structure may have a cross-section taken along the first direction of which a shape substantially the same as the shape illustrated with reference to FIG. 17. In this case, the main contact plug and the recess may be formed by processes that are similar to or the same as the processes illustrated with reference to FIGS. 8 to 11, and then processes that are similar to or the same as the processes illustrated with reference to FIGS. 19 to 21 to form the contact structure.

Referring to FIG. 26 again, an upper insulating interlayer 352 may be formed on the contact structure 350 and the second insulating interlayer 338. The upper insulating interlayer 352 may include, e.g., silicon oxide.

A via contact 354 may be formed through the upper insulating interlayer 352, and may contact an upper surface of the contact structure 350. A metal conductive line 356 may be formed on the via contact 354 and the upper insulating interlayer 352.

The via contact 354 may include a metal. In example embodiments, the via contact 354 may be formed to include a barrier layer and a metal layer. The barrier layer may include, e.g., titanium (Ti), titanium nitride (TiN), tantalum (Ta), tantalum nitride (TaN), TiAlC, cobalt (Co), ruthenium (Ru), nickel (Ni), etc. The metal layer may include, e.g., tungsten (W), copper (Cu), aluminum (Al), etc.

Figure 32:
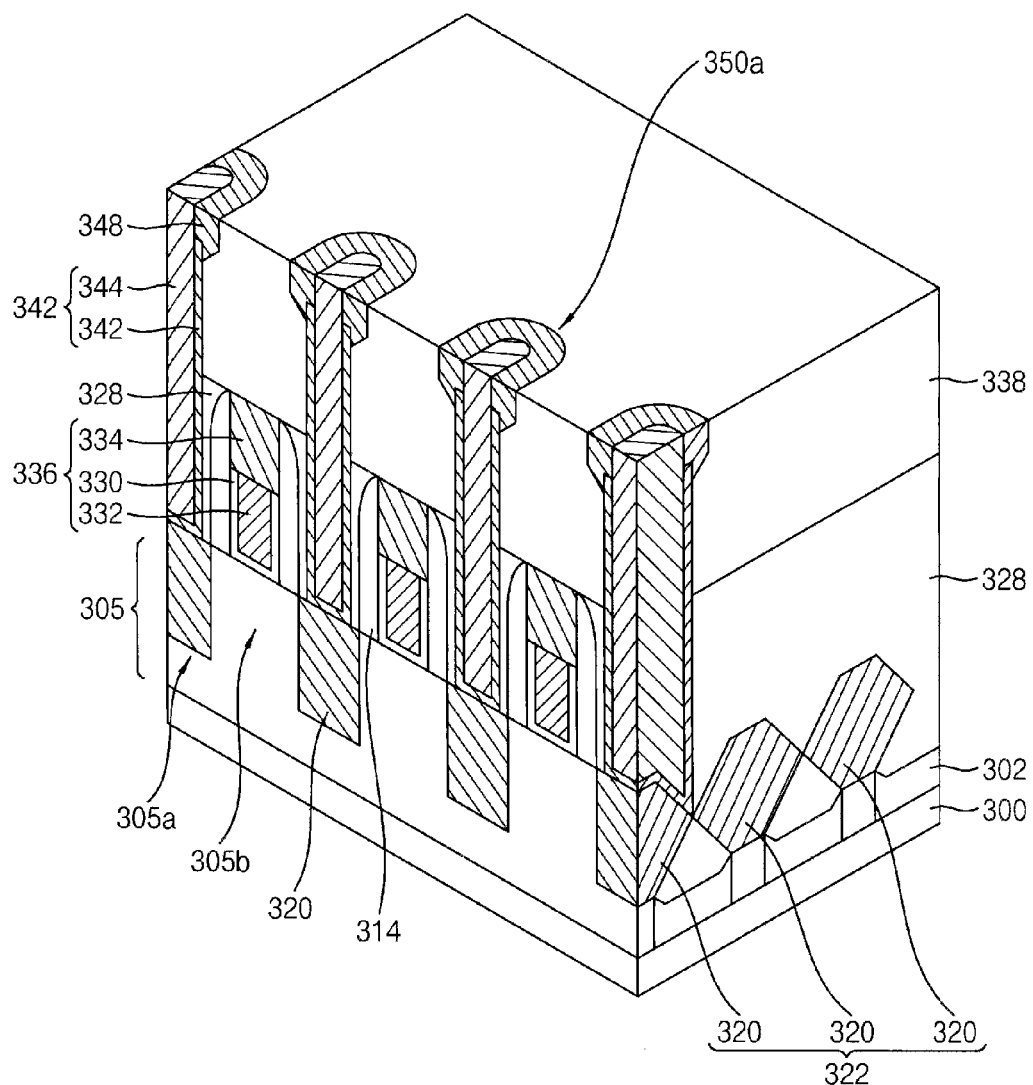

FIG. 32 is a perspective view illustrating a semiconductor device including a contact structure in accordance with example embodiments.

Referring to FIG. 32, the semiconductor device may be substantially the same as the semiconductor device of FIG. 25, except for a shape of contact structure. In example embodiments, the contact structure 350 may contact a portion of the upper surface of the epitaxial structure 322.

In an embodiment of the example inventive concepts, a three dimensional (3D) memory array including the contact structure is provided. The 3D memory array is monolithically formed in one or more physical levels of arrays of memory cells having an active area disposed above a silicon substrate and circuitry associated with the operation of those memory cells, whether such associated circuitry is above or within such substrate. The 3D memory array may include a string of a vertical NAND flash memory. At least one of the memory cells may include charge trap layer.

The following patent documents, which are hereby incorporated by reference in their entirety, describe suitable configurations for 3D memory arrays, in which the 3D memory array is configured as a plurality of levels, with word lines and/or bit lines shared between levels: U.S. Pat. Nos. 7,679,133; 8,553,466; 8,654,587 and 8,559,235. In example embodiments, the 3D memory array may include the contact structure in accordance with example embodiments.

The above semiconductor device may be applied to various types of systems, e.g., computing system.

Figure 33:
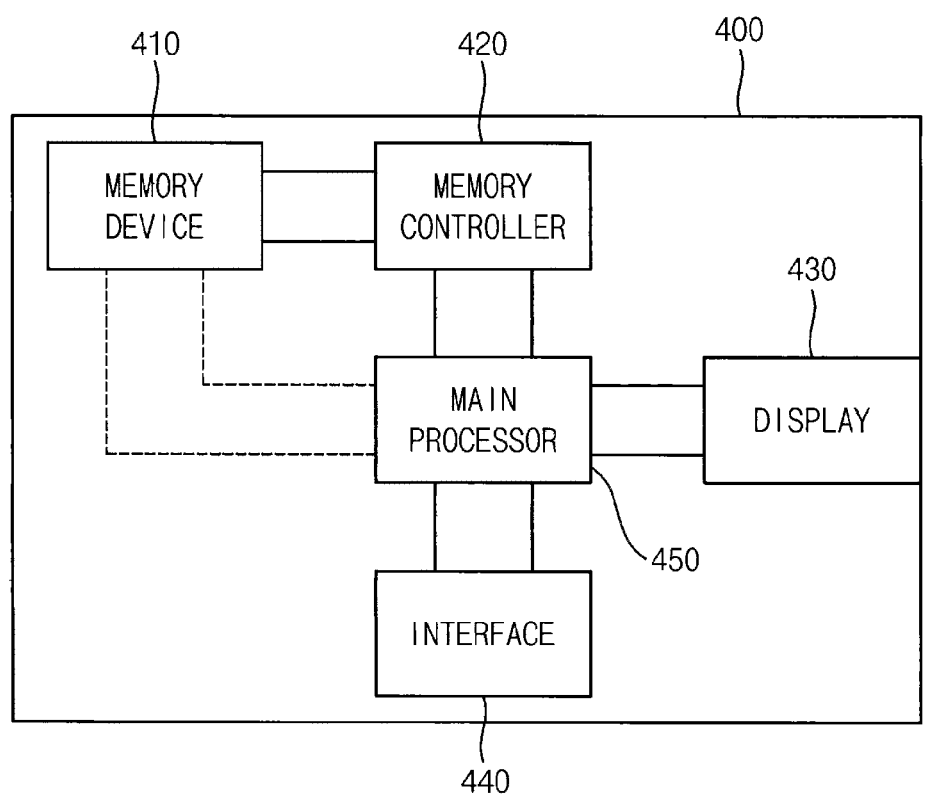

FIG. 33 is a block diagram illustrating a system in accordance with example embodiments.

Referring to FIG. 33, a system 400 may include a memory device 410, a memory controller 420 for controlling operations of the memory device 410, a displayer 430 for outputting data, an interface 440 for receiving data, and a main processor 450 for controlling elements in the system 400.

The memory device 410 may include a semiconductor device including the contact structure in accordance with example embodiments. The memory device 410 may be directly connected to the main processor 450. Alternatively, the memory device 410 may be electrically connected to the main processor 450 via a bus. The system 400 may be applied to a computer, a portable computer, a laptop computer, a personal digital assistant, a tablet personal computer, a mobile phone, a digital music player, etc.

Figure 34:
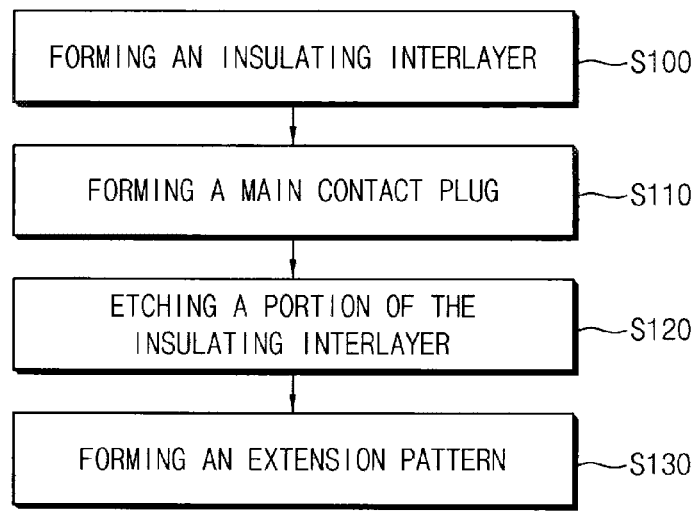
FIG. 34 is a flow diagram illustrating a method of manufacturing a semiconductor device, according to various example embodiments.

FIG. 34 is a flow diagram illustrating a method of manufacturing a semiconductor device, according to various example embodiments. In FIG. 34, the method starts at S100, where an insulating interlayer is formed on a substrate. In one example embodiment, the substrate includes a contact region at an upper portion thereof. In S110, a main contact plug is formed through the insulating interlayer in order to contact the contact region. In one example embodiment, the main contact plug has a pillar shape and includes a first barrier pattern and a metal pattern. In S120, a portion of the insulating interlayer adjacent to a sidewall of the main contact plug is etched in order to form a recess exposing an upper sidewall of the main contact plug. In S130, an extension pattern including a barrier material is formed in the recess.

Figure 35:
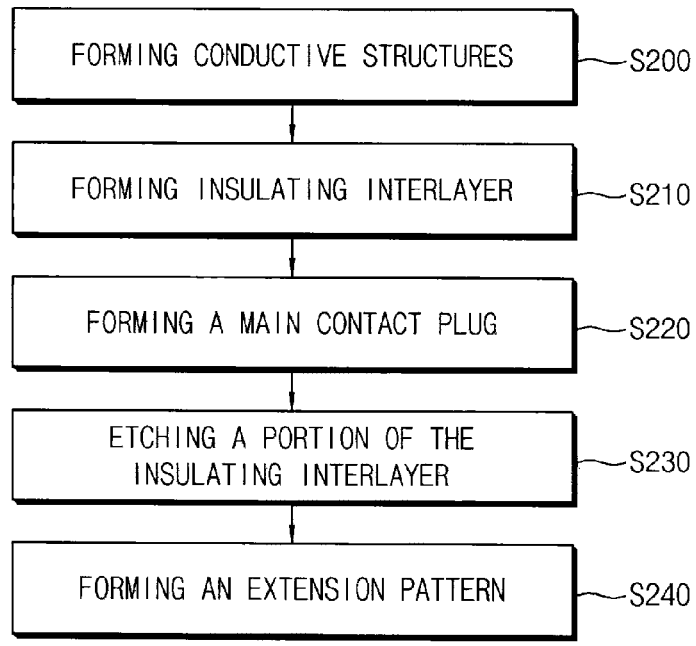
FIG. 35 is a diagram illustrating a method of manufacturing a semiconductor device, according to various example embodiments.

FIG. 35 is a flow diagram illustrating a method of manufacturing a semiconductor device, according to various example embodiments. In FIG. 35, the method starts at S200, where a plurality of conductive structures is formed on a substrate. In one example embodiment, the substrate includes a contact region at an upper portion between the conductive structures, one or more of the conductive structures include a conductive pattern and a capping pattern, and the capping pattern surrounds a surface of the conductive pattern. In S210, an insulating interlayer is formed to cover the conductive structures on the substrate. In one example embodiment, a top surface of the insulating interlayer is higher than top surfaces of the conductive structures. In S220, a main contact plug is formed through the insulating interlayer to contact the contact region. In one example embodiment, the main contact plug has a pillar shape and includes a first barrier pattern and a first metal pattern. In S230, the insulating interlayer adjacent to a sidewall of the main contact plug is partially etched to form a recess exposing an upper sidewall of the main contact plug. In S240, an extension pattern including a barrier material is formed in the recess.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example inventive concepts. Accordingly, all such modifications are intended to be included within the scope of the example inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
    an insulating interlayer on a substrate, the substrate including a contact region at an upper portion thereof;
    a main contact plug through the insulating interlayer and in contact with the contact region of the substrate, the main contact plug having a pillar shape and including a first barrier pattern and a first metal pattern; and
    an extension pattern surrounding an upper sidewall of the main contact plug, the extension pattern including a barrier material,
    wherein a top surface of the first barrier pattern is lower than a top surface of the first metal pattern.

2. The semiconductor device of claim 1, wherein the first metal pattern has a pillar shape, and the first barrier pattern covers a sidewall and a bottom portion of the first metal pattern.

3. The semiconductor device of claim 1, wherein a top surface of the main contact plug is substantially coplanar with a top surface of the extension pattern.

4. The semiconductor device of claim 1, wherein the extension pattern is directly in contact with an upper sidewall of the first metal pattern of the main contact plug.

5. The semiconductor device of claim 1, wherein substantially all portions of the extension pattern include the barrier material.

6. The semiconductor device of claim 1, wherein the extension pattern further comprises a second barrier pattern and a second metal pattern.

7. The semiconductor device of claim 6, wherein the second barrier pattern is in contact with a top surface of the first barrier pattern, an upper sidewall of the first metal pattern and a portion of the insulating interlayer, and wherein the second metal pattern is on the second barrier pattern.

8. The semiconductor device of claim 1, wherein the barrier material of the extension pattern comprises at least one of titanium (Ti), titanium nitride (TiN), tantalum (Ta), tantalum nitride (TaN), TiAlC, cobalt (Co), ruthenium (Ru), and nickel (Ni).

9. A semiconductor device, comprising:
    a plurality of conductive structures on a substrate, the substrate including a contact region at an upper portion thereof between the conductive structures, at least one of the conductive structures including a conductive pattern and a capping pattern, and the capping pattern surrounding a surface of the conductive pattern;
    an insulating interlayer covering the conductive structures on the substrate, a top surface of the insulating interlayer being higher than top surfaces of the conductive structures;
    a main contact plug through the insulating interlayer and contacting the contact region, the main contact plug having a pillar shape and including a first barrier pattern and a first metal pattern; and
    an extension pattern surrounding an upper sidewall of the main contact plug, the extension pattern including a barrier material,
    wherein a top surface of the first barrier pattern is lower than a top surface of the first metal pattern.

10. The semiconductor device of claim 9, wherein the main contact plug has a first width that is substantially the same as or smaller than a second width of the contact region.

11. The semiconductor device of claim 9, wherein a bottom of the extension pattern is higher than top surfaces of the conductive structures.

12. The semiconductor device of claim 9, wherein the extension pattern is apart from and partially overlaps each of the conductive structures vertically.

13. The semiconductor device of claim 9, wherein each of the conductive structures includes a structure and a spacer on a sidewall of the structure, the structure including a gate insulation pattern, a gate electrode and a hard mask sequentially stacked.

14. The semiconductor device of claim 13, wherein the gate electrode includes a metal, and the gate insulation pattern covers a sidewall and a bottom of the gate electrode.

15. The semiconductor device of claim 9, wherein the barrier material of the extension pattern comprises at least one of titanium (Ti), titanium nitride (TiN), tantalum (Ta), tantalum nitride (TaN), TiAlC, cobalt (Co), ruthenium (Ru), and nickel (Ni).

16. A contact structure of a semiconductor device, comprising:
- an insulating interlayer on at least one contact region of a substrate, the insulating interlayer including a first insulating interlayer and a second insulating interlayer;
- a plurality of gate structures on the substrate and formed in the first insulating interlayer;
- at least one main contact plug through the first and second insulating interlayers and in contact with the at least one contact region of the substrate between adjacent ones of the plurality of gate structures, the at least one main contact plug not overlapping the plurality of gate structures in a direction substantially perpendicular to a surface of the substrate; and
- at least one contact extension pattern surrounding at least one upper sidewall of the at least one main contact plug,
- wherein the at least one main contact plug has a pillar shape and includes a first barrier pattern and a first metal pattern, and
- wherein a top surface of the first barrier pattern is lower than a top surface of the first metal pattern.

17. The contact structure of claim 16, wherein the contact extension pattern is directly in contact with an upper sidewall of the first metal pattern of the main contact plug.

18. The contact structure of claim 16, wherein the at least one contact extension pattern comprises a barrier material.

19. The contact structure of claim 16, wherein a top surface of the main contact plug is substantially coplanar with a top surface of the extension pattern.

* * * * *